(12) United States Patent
Shin et al.

(10) Patent No.: US 12,426,475 B2
(45) Date of Patent: Sep. 23, 2025

(54) DISPLAY DEVICE

(71) Applicant: LG Display Co., Ltd., Seoul (KR)

(72) Inventors: Mihee Shin, Gyeonggi-do (KR); Seunghyun Lee, Gyeonggi-do (KR); Junghun Choi, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 505 days.

(21) Appl. No.: 17/974,081

(22) Filed: Oct. 26, 2022

(65) Prior Publication Data

US 2023/0157129 A1   May 18, 2023

(30) Foreign Application Priority Data

Nov. 12, 2021   (KR) .................. 10-2021-0155711

(51) Int. Cl.
| | |
|---|---|
| *H10K 59/65* | (2023.01) |
| *H10D 86/40* | (2025.01) |
| *H10D 86/60* | (2025.01) |
| *H10K 50/86* | (2023.01) |
| *H10K 59/121* | (2023.01) |
| *H10K 59/35* | (2023.01) |

(52) U.S. Cl.
CPC ........... *H10K 59/65* (2023.02); *H10D 86/423* (2025.01); *H10D 86/60* (2025.01); *H10K 50/865* (2023.02); *H10K 59/1213* (2023.02); *H10K 59/353* (2023.02)

(58) Field of Classification Search
None
See application file for complete search history.

(56) References Cited

U.S. PATENT DOCUMENTS

| | | | | |
|---|---|---|---|---|
| 2006/0246619 | A1* | 11/2006 | Imamura | G02F 1/1345 438/57 |
| 2023/0083578 | A1* | 3/2023 | Choi | H10K 77/111 257/91 |
| 2023/0157117 | A1* | 5/2023 | Park | H10K 50/865 257/40 |
| 2023/0165070 | A1* | 5/2023 | Na | H10K 50/844 257/72 |
| 2023/0172029 | A1* | 6/2023 | Lee | H10K 59/65 257/40 |

FOREIGN PATENT DOCUMENTS

| | | | | |
|---|---|---|---|---|
| CN | 111339821 B | * | 12/2024 | ......... G02F 1/13338 |
| TW | 202428164 A | * | 7/2024 | ........... H10K 59/121 |

* cited by examiner

*Primary Examiner* — Michael Lebentritt
(74) *Attorney, Agent, or Firm* — Birch, Stewart, Kolasch & Birch, LLP

(57) ABSTRACT

A display device can include a display panel including a non-display area and a display area. The display area can include a first area, a third area surrounded by the first area, and a second area disposed between the first area and the third area. Here, at least one of the first, second, and third area can include a plurality of light emitting areas and a plurality of transmission areas. The display device can further include an optical electronic device located under, or in a lower portion of, the display panel and overlapping at least a portion of the first area included in the display area. The display panel can include a light shield layer disposed under transistors in the plurality of light emitting areas and not disposed in the plurality of transmission areas.

17 Claims, 15 Drawing Sheets

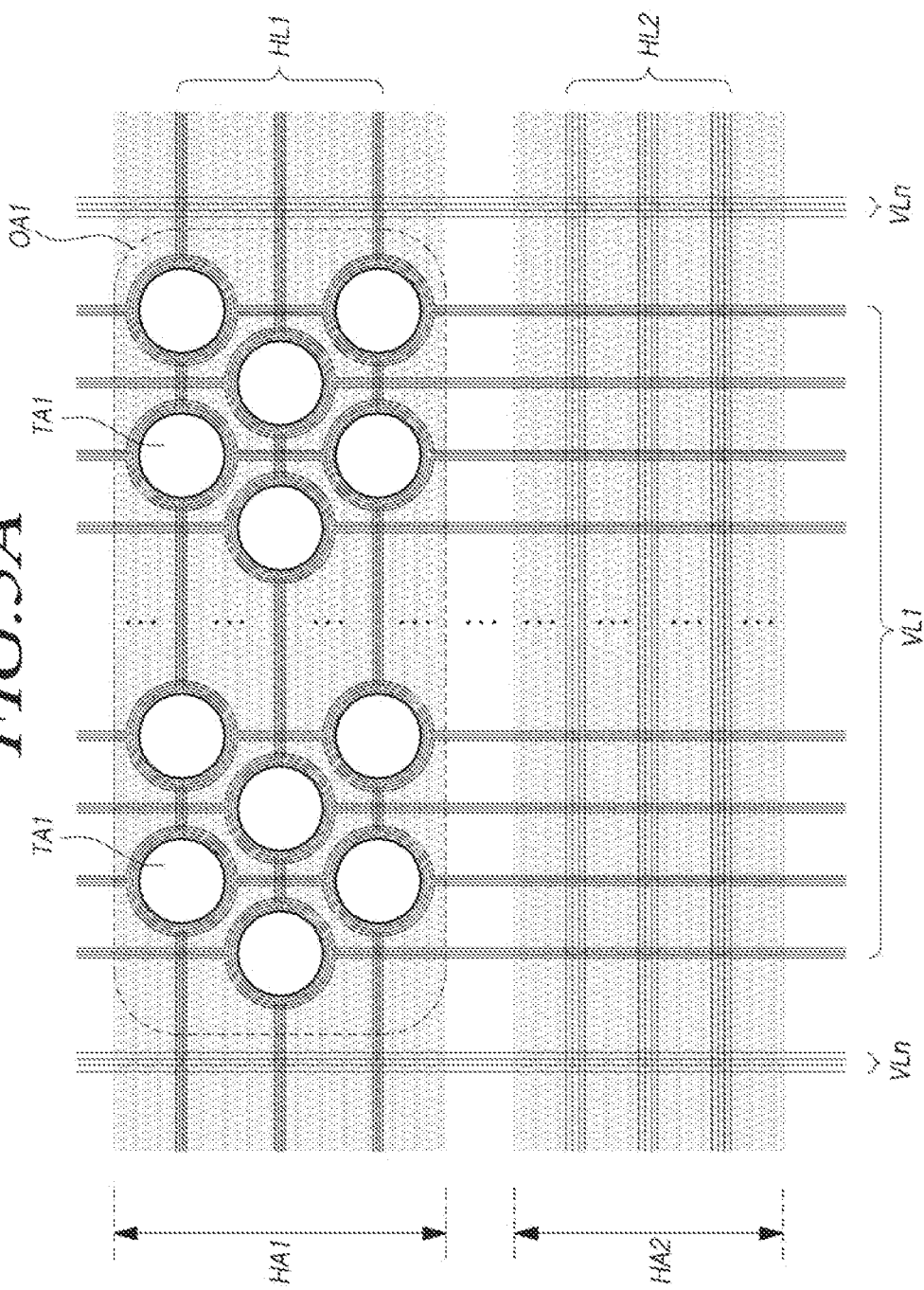

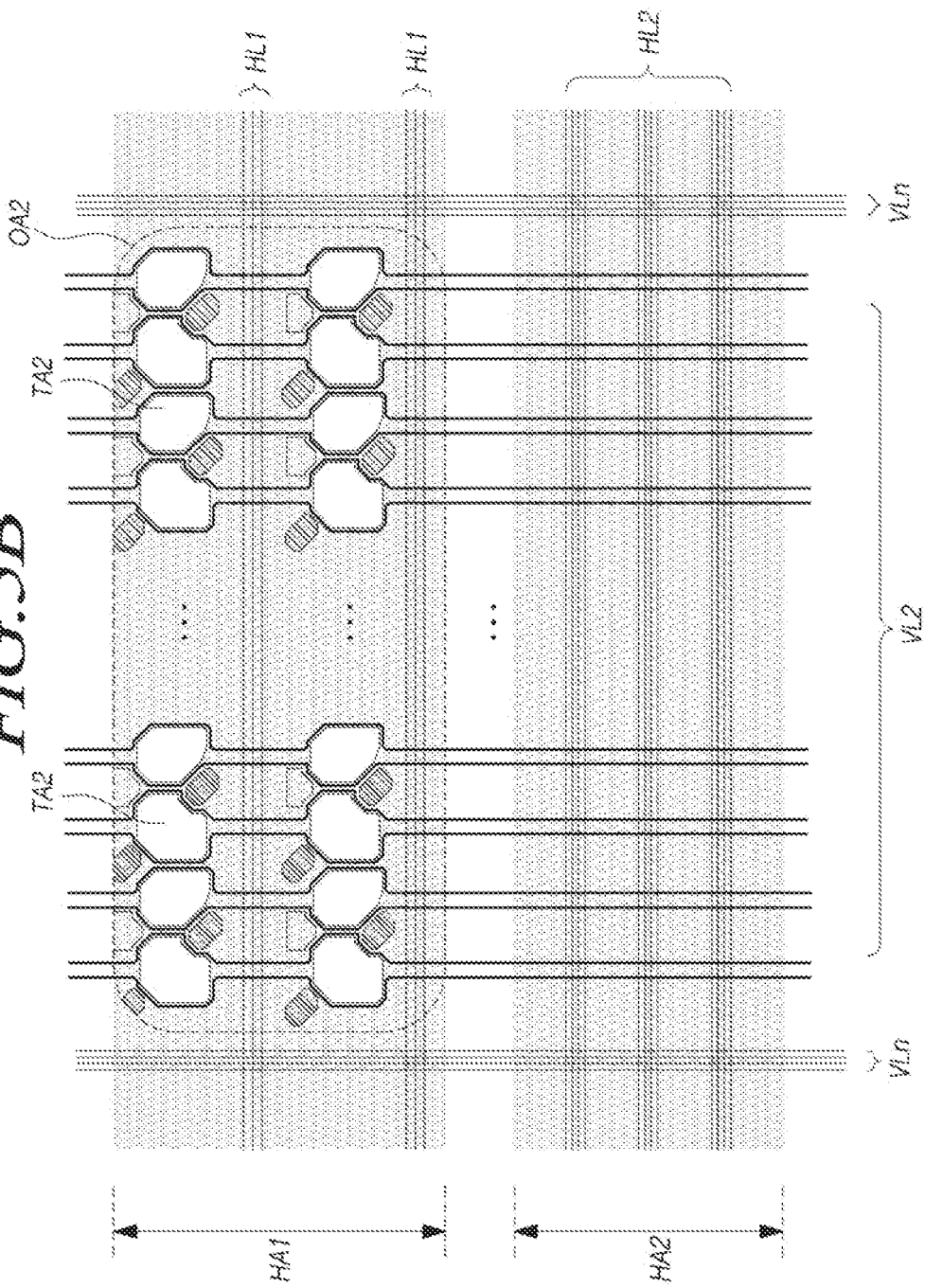

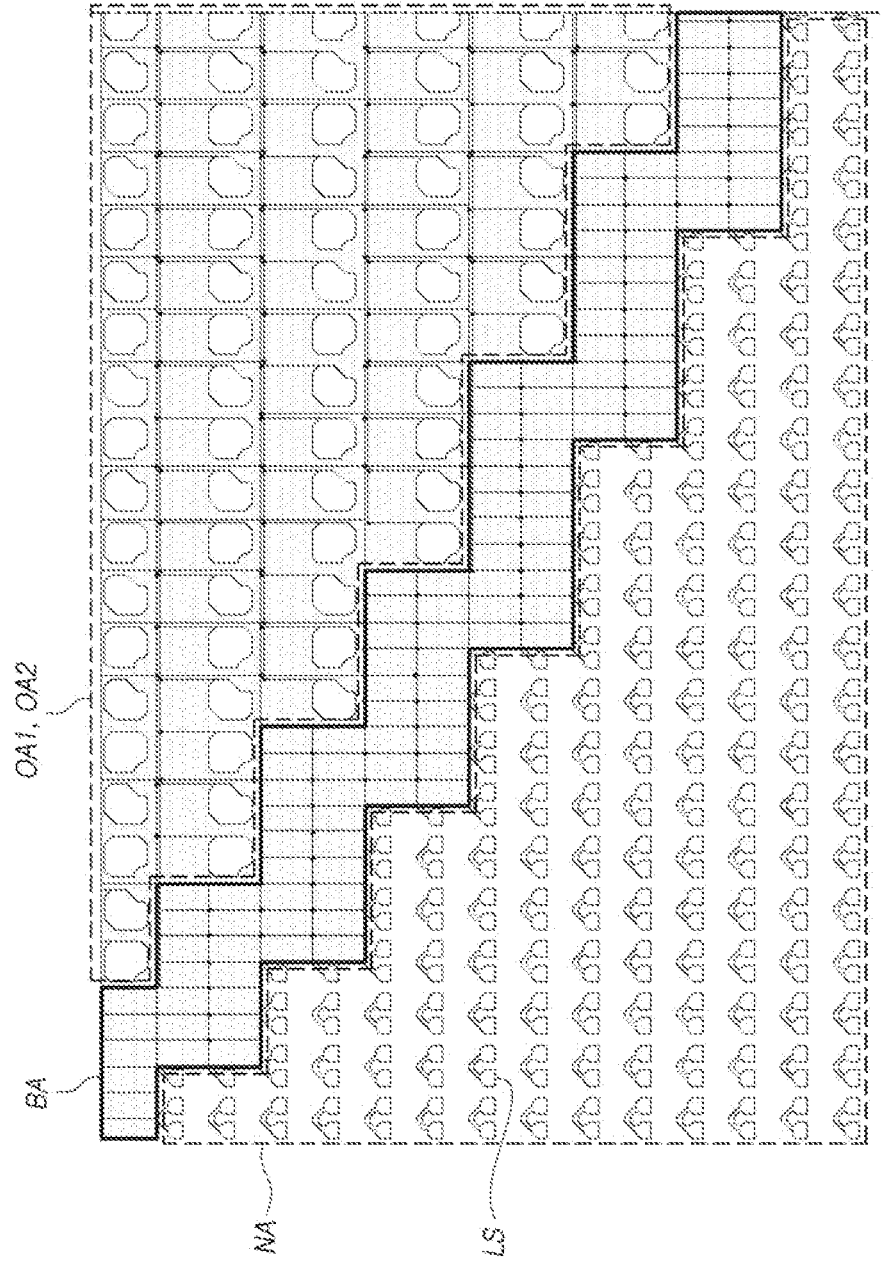

DISPLAY DEVICE

CROSS-REFERENCE TO RELATED APPLICATION

This application claims the priority benefit of Korean Patent Application No. 10-2021-0155711, filed on Nov. 12, 2021 in the Republic of Korea, the entire contents of which are hereby expressly incorporated by reference into the present application.

BACKGROUND

Technical Field

The present disclosure relates to electronic devices, and more particularly, to a display device capable of improving transmittance of an area in which an optical device is disposed.

Description of the Related Art

As display technology advances, display devices can provide increased functions, such as an image capture function, a sensing function, and the like, as well as an image display function. To provide these functions, a display device can include an optical electronic device, such as a camera, a sensor for detecting an image, and the like.

In order to receive light passing through a front surface of a display device, it can be desirable for an optical electronic device to be located in an area of the display device where incident light coming from the front surface can be advantageously received or detected. Thus, in such a display device, an optical electronic device can be located in a front portion of the display device to allow the optical electronic device to be effectively exposed to incident light.

In order to install the optical electronic device in such an implementation, an increased bezel of the display device can be designed, or a notch or a hole can be formed in a display area of a display panel of the display device.

Accordingly, it is desirable that the display device has higher transmittance to perform intended functions even when the optical electronic device (e.g., the camera, the sensor, and/or the like) that receives or detects incident light and performs a predefined function, is attached to the display device.

SUMMARY OF THE DISCLOSURE

The inventors of the present application have developed techniques for providing or placing one or more optical electronic devices in a display device without reducing an area of a display area of a display panel of the display device. Through the development, the inventors of the present application have invented a display device including a light transmission structure in which even when an optical electronic device is located under a display area of a display panel, and thus, is not exposed in the front surface of the display device, the optical electronic device can normally and properly receive or detect light.

Further, the inventors of the present application have invented a display device that has a structure in which an area where an optical electronic device is disposed is configured to have a high transmittance and is capable of forming this structure through a simple process.

One or more embodiments of the present disclosure can provide a display device capable of reducing a non-display area of a display panel and enabling an optical electronic device not to be exposed in the front surface of the display panel by disposing the optical electronic device under a display area, or in a lower portion, of the display panel.

One or more embodiments of the present disclosure can provide a display device having a light transmission structure in which an optical electronic device located under a display area, or in a lower portion, of a display panel has a capability of normally receiving or detecting light.

One or more embodiments of the present disclosure can provide a display device capable of normally performing display driving in an optical area included in a display area of a display panel and overlapping an optical electronic device.

According to aspects of the present disclosure, a display device can include a display panel including a display area having a first area, a third area surrounded by the first area, and a second area disposed between the first area and the third area, and a non-display area adjacent to the display area. The display device can further include an optical electronic device located under, or in a lower portion of, the display panel and overlapping at least a portion of the third area included in the display area. At least one of the first, second, and third area can include a plurality of light emitting areas and a plurality of transmission areas. The display panel can include a light shield layer disposed under transistors in the plurality of light emitting areas and not disposed in the plurality of transmission areas.

According to one or more embodiments of the present disclosure, a display device is provided that is capable of reducing a non-display area of a display panel and enabling an optical electronic device not to be exposed in the front surface of the display panel by disposing the optical electronic device under a display area, or in a lower portion, of the display panel.

According to one or more embodiments of the present disclosure, a display device is provided that has a light transmission structure in which an optical electronic device located under a display area, or in a lower portion, of a display panel has a capability of normally receiving or detecting light.

According to one or more embodiments of the present disclosure, a display device is provided that is capable of normally performing display driving in an optical area included in a display area of a display panel and overlapping an optical electronic device.

According to one or more embodiments of the present disclosure, a display device can be provided that has a structure in which an area where an optical electronic device is disposed is configured to have a high transmittance and is capable of forming this structure through a simple process.

According to one or more embodiments of the present disclosure, a display device is provided that prevents driving transistors in a boundary area from being affected by light diffraction even when a laser beam is irradiated to a first optical area and a second optical area to form a plurality of transmission areas as a light shield layer is formed in the entire area of a boundary area.

Additional features and aspects will be set forth in part in the description which follows and in part will become apparent from the description or can be learned by practice of the inventive concepts provided herein. Other features and aspects of the inventive concepts can be realized and attained by the structure particularly pointed out in, or derivable from, the written description, the claims hereof, and the appended drawings. Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims. It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings:

FIG. 5A illustrates example arrangements of signal lines in each of the first optical area and a normal area in the display panel according to aspects of the present disclosure;

FIG. 5B illustrates example arrangements of signal lines in each of a second optical area and the normal area in the display panel according to aspects of the present disclosure;

FIG. 8 illustrates a light shield layer disposed in a display area of the display panel according to aspects of the present disclosure.

DETAILED DESCRIPTION OF THE EMBODIMENTS

Figure 1A:
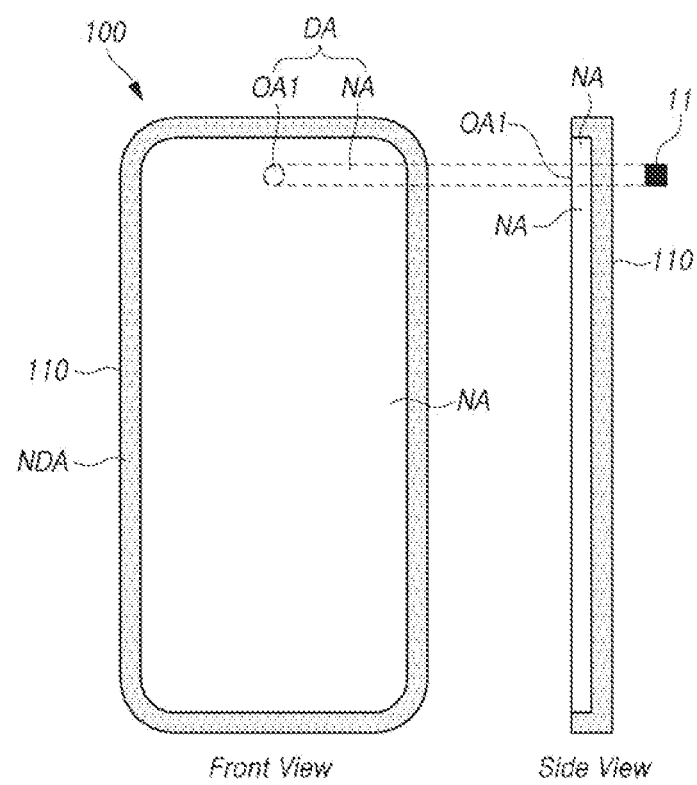
FIGS. 1A, 1B, 1C and 1D are plan views illustrating an example display device according to aspects of the present disclosure.

Reference will now be made in detail to embodiments of the present disclosure, examples of which can be illustrated in the accompanying drawings. In the following description, the structures, embodiments, implementations, methods and operations described herein are not limited to the specific example or examples set forth herein and can be changed as is known in the art, unless otherwise specified. Names of the respective elements used in the following explanations are selected only for convenience of writing the specification and can thus be different from those used in actual products.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals designate like elements throughout, unless otherwise specified. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the protected scope of the present disclosure is defined by claims and their equivalents. In the following description, where the detailed description of the relevant known function or configuration can unnecessarily obscure aspects of the present disclosure, a detailed description of such known function or configuration can be omitted. Where the terms "comprise," "have," "include," "contain," "constitute," "make up of," "formed of," and the like are used, one or more other elements can be added unless the term, such as "only," is used. An element described in the singular form is intended to include a plurality of elements, and vice versa, unless the context clearly indicates otherwise. Singular forms used herein are intended to include plural forms unless the context clearly indicates otherwise.

In construing an element, the element is to be construed as including an error or tolerance range even where no explicit description of such an error or tolerance range is provided.

Where positional relationships are described, for example, where the positional relationship between two parts is described using "on," "over," "under," "above," "below," "beside," "next," or the like, one or more other parts can be located between the two parts unless a more limiting term, such as "immediate(ly)," "direct(ly)," or "close(ly)" is used. For example, where an element or layer is disposed "on" another element or layer, a third element or layer can be interposed therebetween. Furthermore, the terms "left," "right," "top," "bottom, "downward," "upward," "upper," "lower," and the like refer to an arbitrary frame of reference. Time relative terms, such as "after", "subsequent to", "next to", "before", or the like, used to describe a temporal relationship between events, operations, or the like are generally intended to include events, situations, cases, operations, or the like that do not occur consecutively unless the terms, such as "directly", "immediately", or the like, are used.

In describing a temporal relationship, when the temporal order is described as, for example, "after," "subsequent," "next," or "before," a case which is not continuous can be included unless a more limiting term, such as "just," "immediate(ly)," or "direct(ly)," is used.

Although the terms "first," "second," A, B, (a), (b), and the like can be used herein to describe various elements, these elements should not be interpreted to be limited by these terms as they are not used to define a particular order or precedence. These terms are merely used herein for distinguishing an element from other elements. The expression of a first element, a second elements "and/or" a third element should be understood as one of the first, second and third elements or as any or all combinations of the first, second and third elements.

By way of example, A, B and/or C can refer to only A, only B, or only C; any or some combination of A, B, and C; or all of A, B, and C. Therefore, a first element mentioned below can be a second element in a technical concept of the present disclosure. Further, the term "may" fully encompasses all the meanings of the term "can." The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Hereinafter, with reference to the accompanying drawings, various embodiments of the present disclosure will be described in detail. All the components of each display device according to all embodiments of the present disclosure are operatively coupled and configured.

FIGS. 1A, 1B, 1C and 1D are plan views illustrating an example display device 100 according to aspects of the present disclosure.

Referring to FIGS. 1A, 1B, 1C, and 1D, the display device 100 according to aspects of the present disclosure can include a display panel 110 for displaying images, and one or more optical electronic devices (11 and/or 12).

The display panel 110 can include a display area DA in which an image is displayed and a non-display area NDA in which an image is not displayed.

A plurality of subpixels can be arranged in the display area DA, and several types of signal lines for driving the plurality of subpixels can be arranged therein.

The non-display area NDA can refer to an area outside of the display area DA. Several types of signal lines can be arranged in the non-display area NDA, and several types of driving circuits can be connected thereto. At least a portion of the non-display area NDA can be bent to be invisible from the front of the display panel or can be covered by a case of the display panel 110 or the display device 100. The non-display area NDA can be also referred to as a bezel or a bezel area.

Referring to FIGS. 1A, 1B, 1C, and 1D, in the display device 100 according to aspects of the present disclosure, the one or more optical electronic devices (11 and/or 12) can be located under, or in a lower portion of, the display panel 110 (an opposite side to the viewing surface thereof).

Light can enter the front surface (viewing surface) of the display panel 110, pass through the display panel 110, reach one or more optical electronic devices (11 and/or 12) located under, or in the lower portion of, the display panel 110 (the opposite side of the viewing surface).

The one or more optical electronic devices (11 and/or 12) can receive or detect light transmitting through the display panel 110 and perform a predefined function based on the received light. For example, the one or more optical electronic devices (11 and/or 12) can include one or more of the following: an image capture device such as a camera (an image sensor), and/or the like; or a sensor such as a proximity sensor, an illuminance sensor, and/or the like.

Referring to FIGS. 1A, 1B, 1C, and 1D, in the display panel 110 according to aspects of the present disclosure, the display area DA can include one or more optical areas (OA1 and/or OA2) and a normal area NA. Herein, the term "normal area" NA is an area that while being present in the display area DA, does not overlap with one or more optical electronic devices (11 and/or 12) and can also be referred to as a non-optical area.

Referring to FIGS. 1A, 1B, 1C, and 1D, the one or more optical areas (OA1 and/or OA2) can be one or more areas overlapping the one or more optical electronic devices (11 and/or 12).

According to an example of FIG. 1A, the display area DA can include a first optical area OA1 and a normal area NA. In this example, at least a portion of the first optical area OA1 can overlap a first optical electronic device 11.

Although FIG. 1A illustrates a structure in which the first optical area OA1 has a circular shape, the shape of the first optical area OA1 according to embodiments of the present disclosure is not limited thereto.

Figure 1B:
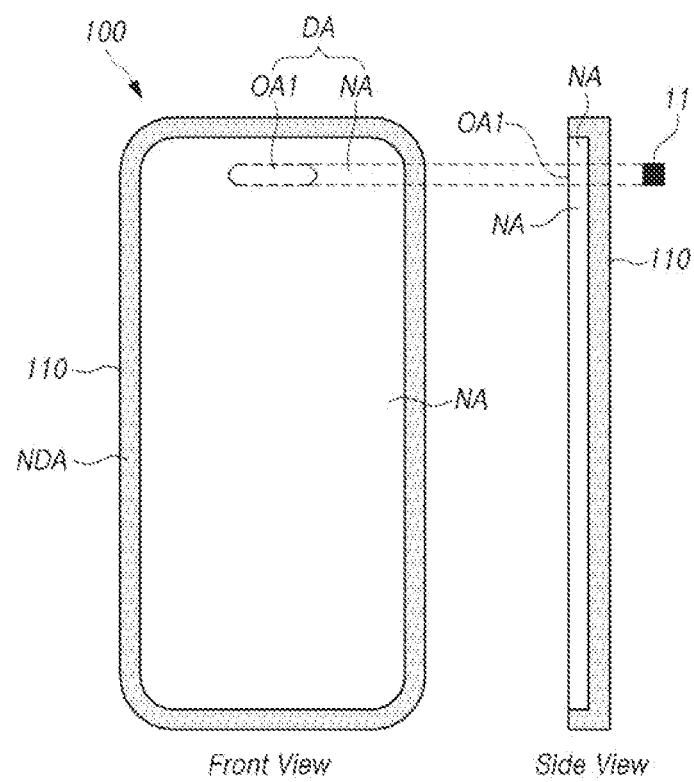

For example, as shown in FIG. 1B, the first optical area OA1 can have an octagonal shape, or various polygonal shapes.

Figure 1C:
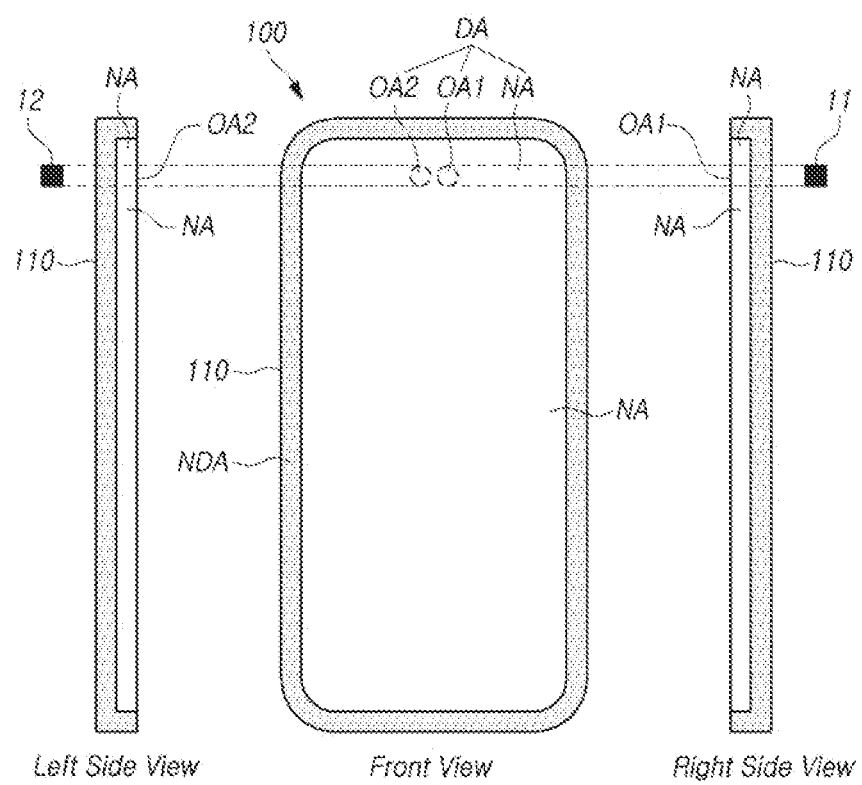

According to an example of FIG. 1C, the display area DA can include a first optical area OA1, a second optical area OA2, and a normal area NA. In the example of FIG. 1C, at least a portion of the normal area NA can be present between the first optical area OA1 and the second optical area OA2. In this example, at least a portion of the first optical area OA1 can overlap the first optical electronic device 11, and at least a portion of the second optical area OA2 can overlap a second optical electronic device 12.

Figure 1D:
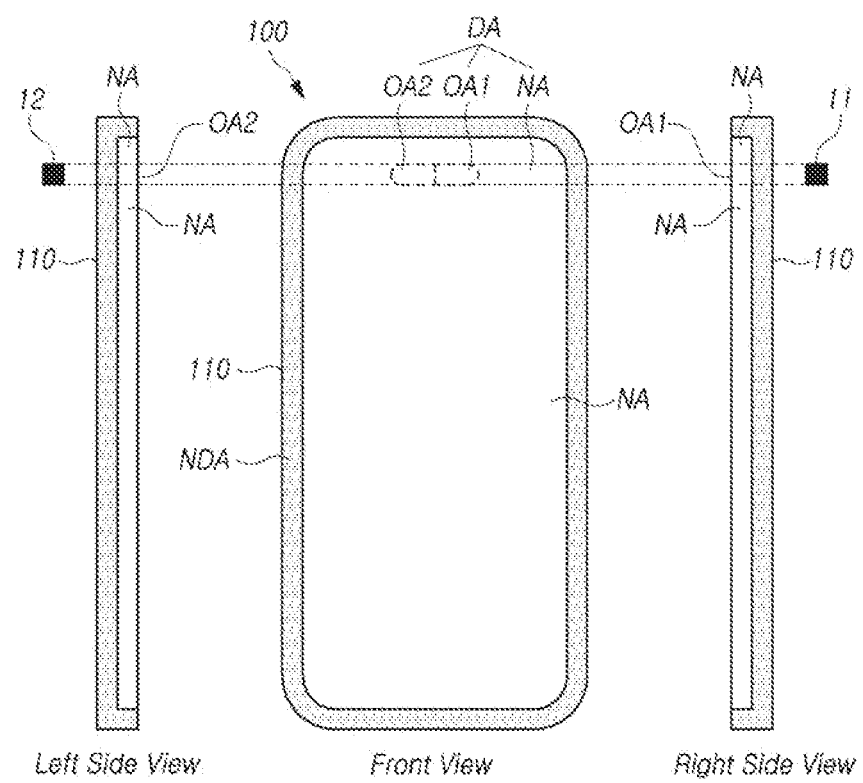

According to an example of FIG. 1D, the display area DA can include a first optical area OA1, a second optical area OA2, and a normal area NA. In the example of FIG. 1D, the normal area NA may not be present between the first optical area OA1 and the second optical area OA2. For example, the first optical area OA1 and the second optical area OA2 can contact each other (e.g., directly contact each other). In this example, at least a portion of the first optical area OA1 can overlap the first optical electronic device 11, and at least a portion of the second optical area OA2 can overlap the second optical electronic device 12.

In some embodiments, an image display structure and a light transmission structure are desirable to be formed in the one or more optical areas (OA1 and/or OA2). For example, since the one or more optical areas (OA1 and/or OA2) are a portion of the display area DA, therefore, subpixels for displaying an image are needed to be disposed in the one or more optical areas (OA1 and/or OA2). Further, to enable light to be transmitted through the one or more optical electronic devices (11 and/or 12), a light transmission structure is needed, and thus is formed in the one or more optical areas (OA1 and/or OA2).

Even though the one or more optical electronic devices (11 and/or 12) are needed to receive or detect light, the one or more optical electronic devices (11 and/or 12) can be located on the back of the display panel 110 (e.g., on an opposite side of a viewing surface). In this embodiment, the one or more optical electronic devices (11 and/or 12) are located, for example, under, or in a lower portion of, the display panel 110, and is configured to receive light that has been transmitted through the display panel 110.

For example, the one or more optical electronic devices (11 and/or 12) are not exposed in the front surface (viewing surface) of the display panel 110. Accordingly, when a user looks at the front of the display device 100, the one or more optical electronic devices (11 and/or 12) are located to be invisible to the user.

In one embodiment, the first optical electronic device 11 can be a camera, and the second optical electronic device 12 can be a sensor such as a proximity sensor, an illuminance sensor, an infrared sensor, and/or the like. For example, the camera can be a camera lens, an image sensor, or a unit including at least one of the camera lens and the image sensor. The sensor can be, for example, an infrared sensor capable of detecting infrared rays.

In another embodiment, the first optical electronic device 11 can be a sensor, and the second optical electronic device 12 can be a camera.

Hereinafter, simply for convenience, discussions that follow will refer to embodiments where the first optical electronic device 11 is a camera, and the second optical electronic device 12 is a sensor. It should be, however, understood that the scope of the present disclosure includes embodiments where the first optical electronic device 11 is the sensor, and the second optical electronic device 12 is the camera. For example, the camera can be a camera lens, an image sensor, or a unit including at least one of the camera lens and the image sensor.

In the example where the first optical electronic device 11 is a camera, this camera can be located on the back of (e.g., under, or in a lower portion of) the display panel 110, and be a front camera capable of capturing objects or images in a front direction of the display panel 110. Accordingly, the user can capture an image or object through the camera that is invisible on the viewing surface while looking at the viewing surface of the display panel 110.

Although the normal area NA and the one or more optical areas (OA1 and/or OA2) included in the display area DA in each of FIGS. 1A, 1B, 1C, and 1D are areas where images can be displayed, the normal area NA is an area where a light transmission structure need not be formed, whereas the one or more optical areas (OA1 and/or OA2) are areas where the light transmission structure need be formed. Thus, in some embodiments, the normal area NA is an area where a light transmission structure is not implemented or included, and the one or more optical areas (OA1 and/or OA2) are areas in which the light transmission structure is implemented or included.

Accordingly, the one or more optical areas (OA1 and/or OA2) can have a transmittance greater than or equal to a predetermined level, i.e., a relatively high transmittance, and the normal area NA may not have light transmittance or have a transmittance less than the predetermined level (i.e., a relatively low transmittance).

For example, the one or more optical areas (OA1 and/or OA2) can have a resolution, a subpixel arrangement structure, the number of subpixels per unit area, an electrode structure, a line structure, an electrode arrangement structure, a line arrangement structure, or/and the like different from that/those of the normal area NA.

In one embodiment, the number of subpixels per unit area in the one or more optical areas (OA1 and/or OA2) can be smaller than the number of subpixels per unit area in the non-optical area NA. For example, the resolution of the one or more optical areas (OA1 and/or OA2) can be lower than that of the normal area NA. Here, the number of subpixels per unit area can be a unit for measuring resolution, for example, referred to as pixels (or subpixels) per inch (PPI), which represents the number of pixels within 1 inch.

In one embodiment, in each of FIGS. 1A, 1B, 1C, and 1D, the number of subpixels per unit area in the first optical areas OA1 can be smaller than the number of subpixels per unit area in the non-optical area NA. In one embodiment, in each of FIGS. 1C and 1D, the number of subpixels per unit area in the second optical areas OA2 can be greater than or equal to the number of subpixels per unit area in the first optical areas OA1.

In each of FIGS. 1A, 1B, 1C, and 1D, the first optical area OA1 can have various shapes, such as a circle, an ellipse, a quadrangle, a hexagon, an octagon or the like. In each of FIGS. 1C, and 1D, the second optical area OA2 can have various shapes, such as a circle, an ellipse, a quadrangle, a hexagon, an octagon or the like. The first optical area OA1 and the second optical area OA2 can have the same shape or different shapes.

Referring to FIG. 1C, in the example where the first optical area OA1 and the second optical area OA2 contact each other, the entire optical area including the first optical area OA1 and the second optical area OA2 can also have various shapes, such as a circle, an ellipse, a quadrangle, a hexagon, an octagon or the like.

Hereinafter, for convenience of description, discussions will be provided based on embodiments in which each of the first optical area OA1 and the second optical area OA2 has a circular shape. It should be, however, understood that the scope of the present disclosure includes embodiments where one or both of the first optical area OA1 and the second optical area OA2 have a shape other than a circular shape.

Herein, the display device 100 according to aspects of the present disclosure having a structure in which the first optical electronic device 11 located to be covered under, or in the lower portion of, the display panel 110 without being exposed to the outside is a camera can be referred to as a display (or display device) to which under-display camera (UDC) technology is applied.

The display device 100 according to this configuration can have an advantage of preventing the size of the display area DA from being reduced since a notch or a camera hole for exposing a camera need not be formed in the display panel 110.

Since the notch or the camera hole for camera exposure need not be formed in the display panel 110, the display device 100 can have further advantages of reducing the size of the bezel area, and improving the degree of freedom in design as such limitations to the design are removed.

Although the one or more optical electronic devices (11 and/or 12) are located to be covered on the back of (under, or in the lower portion of) the display panel 110 in the display device 100 according to aspects of the present disclosure, for example, hidden not to be exposed to the outside, the one or more optical electronic devices (11 and/or 12) are needed to be able to receive or detect light for normally performing predefined functionality.

Further, in the display device 100 according to aspects of the present disclosure, although the one or more optical electronic devices (11 and/or 12) are located to be covered on the back of (under, or in the lower portion of) the display panel 110 and located to overlap the display area DA, it is necessary for image display to be normally performed in the one or more optical areas (OA1 and/or OA2) overlapping the one or more optical electronic devices (11 and/or 12) in the display area DA.

Figure 2:
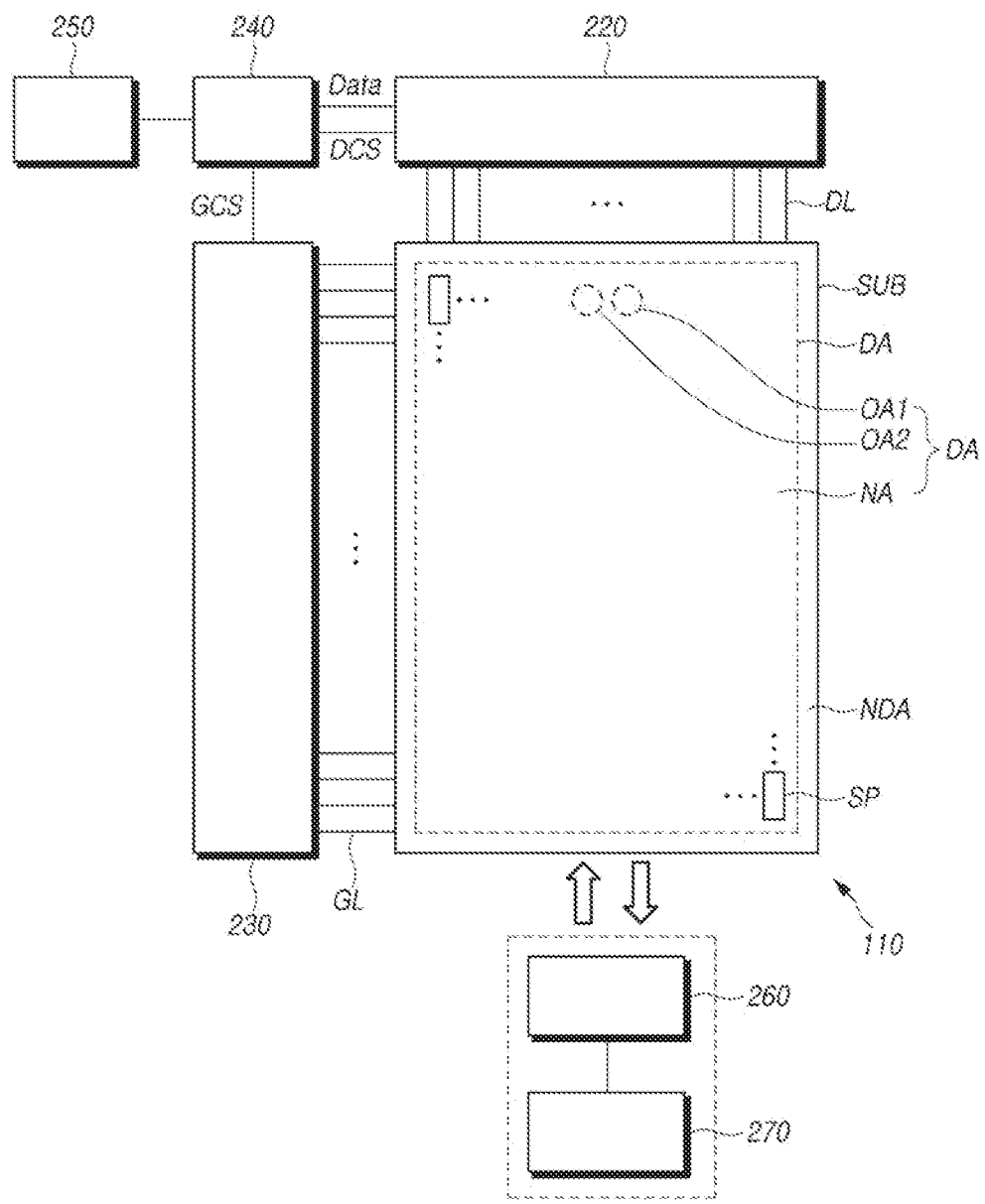
FIG. 2 illustrates an example system configuration of the display device according to aspects of the present disclosure.

FIG. 2 illustrates an example system configuration of the display device 100 according to aspects of the present disclosure.

Referring to FIG. 2, the display device 100 can include the display panel 110 and a display driving circuit as components for displaying an image.

The display driving circuit is a circuit for driving the display panel 110, and can include a data driving circuit 220, a gate driving circuit 230, a display controller 240, and other components.

The display panel 110 can include a display area DA in which an image is displayed and a non-display area NDA in which an image is not displayed. The non-display area NDA can be an area outside of the display area DA, and can also be referred to as an edge area or a bezel area. All or a portion of the non-display area NDA can be an area visible from the front surface of the display device 100, or an area that is not visible from the front surface of the display device 100 as a corresponding portion is bent.

The display panel 110 can include a substrate SUB and a plurality of subpixels SP disposed on the substrate SUB. The display panel 110 can further include various types of signal lines to drive the plurality of subpixels SP.

In some embodiments, the display device 100 herein can be a liquid crystal display device, or the like, or a self-emission display device in which light is emitted from the display panel 110 itself. In the example where the display device 100 according to aspects of the present disclosure is the self-emission display device, each of the plurality of pixels SP can include a light emitting element.

In one embodiment, the display device 100 according to aspects of the present disclosure can be an organic light emitting display device in which the light emitting element is implemented using an organic light emitting diode (OLED). In another embodiment, the display device 100 according to aspects of the present disclosure can be an inorganic light emitting display device in which the light emitting element is implemented using an inorganic material-based light emitting diode. In further another embodiment, the display device 100 according to aspects of the present disclosure can be a quantum dot display device in which the light emitting element is implemented using quantum dots, which are self-emission semiconductor crystals.

The structure of each of the plurality of pixels SP can vary according to types of the display devices 100. In the example where the display device 100 is a self-emission display device including self-emission subpixels SP, each subpixel SP can include a self-emission light emitting element, one or more transistors, and one or more capacitors.

The various types of signal lines arranged in the display device 100 can include, for example, a plurality of data lines DL for carrying data signals (which can be referred to as data voltages or image signals), a plurality of gate lines GL for carrying gate signals (which can be referred to as scan signals), and the like.

The plurality of data lines DL and the plurality of gate lines GL can intersect each other. Each of the plurality of data lines DL can extend in a first direction. Each of the plurality of gate lines GL can extend in a second direction.

For example, the first direction can be a column or vertical direction, and the second direction can be a row or horizontal direction. In another example, the first direction can be the row direction, and the second direction can be the column direction.

The data driving circuit 220 can be a circuit for driving the plurality of data lines DL, and can supply data signals to the plurality of data lines DL. The gate driving circuit 230 can be a circuit for driving the plurality of gate lines GL, and can supply gate signals to the plurality of gate lines GL.

The display controller 240 can be a device for controlling the data driving circuit 220 and the gate driving circuit 230, and can control driving timing for the plurality of data lines DL and driving timing for the plurality of gate lines GL.

The display controller 240 can supply a data driving control signal DCS to the data driving circuit 220 to control the data driving circuit 220, and supply a gate driving control signal GCS to the gate driving circuit 230 to control the gate driving circuit 230.

The display controller 240 can receive input image data from a host system 250 and supply image data Data to the data driving circuit 220 based on the input image data.

The data driving circuit 220 can supply data signals to the plurality of data lines DL according to driving timing control of the display controller 240.

The data driving circuit 220 can receive the digital image data Data from the display controller 240, convert the received image data Data into analog data signals, and supply the resulting analog data signals to the plurality of data lines DL.

The gate driving circuit 230 can supply gate signals to the plurality of gate lines GL according to timing control of the display controller 240. The gate driving circuit 230 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some embodiments, the data driving circuit 220 can be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In some embodiments, the gate driving circuit 230 can be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 can be disposed in the non-display area NDA of the display panel 110 in a gate in panel (GIP) type. The gate driving circuit 230 can be disposed on or over the substrate, or connected to the substrate. For example, in the case of the GIP type, the gate driving circuit 230 can be disposed in the non-display area NDA of the substrate. The gate driving circuit 230 can be connected to the substrate in the case of the chip on glass (COG) type, the chip on film (COF) type, or the like.

In some embodiments, at least one of the data driving circuit 220 and the gate driving circuit 230 can be disposed in the display area DA of the display panel 110. For example, at least one of the data driving circuit 220 and the gate driving circuit 230 can be disposed not to overlap subpixels SP, or disposed to be overlapped with one or more, or all, of the subpixels SP.

The data driving circuit 220 can also be located on, but not limited to, only one side or portion (e.g., an upper edge or a lower edge) of the display panel 110. In some embodiments, the data driving circuit 220 can be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 can be located in only one side or portion (e.g., a left edge or a right edge) of the display panel 110. In some embodiments, the gate driving circuit 230 can be connected to two sides or portions (e.g., a left edge and a right edge) of the display panel 110, or be connected to at least two of four sides or portions (e.g., an upper edge, a lower edge, the left edge, and the right edge) of the display panel 110 according to driving schemes, panel design schemes, or the like.

The display controller 240 can be implemented in a separate component from the data driving circuit 220, or integrated with the data driving circuit 220 and thus implemented in an integrated circuit.

The display controller 240 can be a timing controller used in the typical display technology or a controller or a control device capable of performing other control functions in addition to the function of the typical timing controller. In some embodiments, the display controller 140 can be a controller or a control device different from the timing controller, or a circuitry or a component included in the controller or the control device. The display controller 240 can be implemented with various circuits or electronic components such as an integrated circuit (IC), a field programmable gate array (FPGA), an application specific integrated circuit (ASIC), a processor, and/or the like.

The display controller 240 can be mounted on a printed circuit board, a flexible printed circuit, and/or the like and be electrically connected to the gate driving circuit 230 and the data driving circuit 220 through the printed circuit board, flexible printed circuit, and/or the like.

The display controller 240 can transmit signals to, and receive signals from, the data driving circuit 220 via one or more predefined interfaces. In some embodiments, such interfaces can include a low voltage differential signaling (LVDS) interface, an embedded clock point-point interface (EPI), a serial peripheral interface (SPI), and the like.

In some embodiments, in order to further provide a touch sensing function, as well as an image display function, the display device 100 can include at least one touch sensor, and a touch sensing circuit capable of detecting whether a touch event occurs by a touch object such as a finger, a pen, or the like, or of detecting a corresponding touch position, by sensing the touch sensor.

The touch sensing circuit can include a touch driving circuit 260 capable of generating and providing touch sensing data by driving and sensing the touch sensor, a touch controller 270 capable of detecting the occurrence of a touch event or detecting a touch position using the touch sensing data, and one or more other components.

The touch sensor can include a plurality of touch electrodes. The touch sensor can further include a plurality of touch lines for electrically connecting the plurality of touch electrodes to the touch driving circuit 260.

The touch sensor can be implemented in a touch panel, or in the form of a touch panel, outside of the display panel 110, or be implemented inside of the display panel 110. In the example where the touch sensor is implemented in the touch panel, or in the form of the touch panel, outside of the display panel 110, such a touch sensor is referred to as an add-on type. In the example where the add-on type of touch sensor is disposed, the touch panel and the display panel 110 can be separately manufactured and coupled during an assembly process. The add-on type of touch panel can include a touch panel substrate and a plurality of touch electrodes on the touch panel substrate.

In the example where the touch sensor is implemented inside of the display panel 110, a process of manufacturing the display panel 110 can include disposing the touch sensor over the substrate SUB together with signal lines and electrodes related to driving the display device 100.

The touch driving circuit 260 can supply a touch driving signal to at least one of the plurality of touch electrodes, and sense at least one of the plurality of touch electrodes to generate touch sensing data.

The touch sensing circuit can perform touch sensing using a self-capacitance sensing technique or a mutual-capacitance sensing technique.

In the example where the touch sensing circuit performs touch sensing in the self-capacitance sensing technique, the touch sensing circuit can perform touch sensing based on capacitance between each touch electrode and a touch object (e.g., a finger, a pen, and the like).

According to the self-capacitance sensing technique, each of the plurality of touch electrodes can serve as both a driving touch electrode and a sensing touch electrode. The touch driving circuit 260 can drive all, or one or more, of the plurality of touch electrodes and sense all, or one or more, of the plurality of touch electrodes.

In the example where the touch sensing circuit performs touch sensing in the mutual-capacitance sensing technique, the touch sensing circuit can perform touch sensing based on capacitance between touch electrodes.

According to the mutual-capacitance sensing technique, the plurality of touch electrodes are divided into driving touch electrodes and sensing touch electrodes. The touch driving circuit 260 can drive the driving touch electrodes and sense the sensing touch electrodes.

The touch driving circuit 260 and the touch controller 270 included in the touch sensing circuit can be implemented in separate devices or in a single device. Further, the touch driving circuit 260 and the data driving circuit 220 can be implemented in separate devices or in a single device.

The display device 100 can further include a power supply circuit for supplying various types of power to the display driving circuit and/or the touch sensing circuit.

In some embodiments, the display device 100 can be a mobile terminal such as a smart phone, a tablet, or the like, or a monitor, a television (TV), or the like. Such devices can be of various types, sizes, and shapes. The display device 100 according to embodiments of the present disclosure are not limited thereto, and includes displays of various types, sizes, and shapes for displaying information or images.

As described above, the display area DA of the display panel 110 can include a normal area NA and one or more optical areas (OA1 and/or OA2), for example, as shown in FIGS. 1A, 1B, 1C, and 1D.

The normal area NA and the one or more optical areas (OA1 and/or OA2) are areas where an image can be displayed. However, the normal area NA is an area in which a light transmission structure need not be implemented, and the one or more optical areas (OA1 and/or OA2) are areas in which the light transmission structure need be implemented.

As discussed above with respect to the examples of FIGS. 1A, 1B, 1C, and 1D, although the display area DA of the display panel 110 can include the one or more optical areas (OA1 and/or OA2) in addition to the normal area NA, for convenience of description, in the discussion that follows, it is assumed that the display area DA includes first and second optical areas (OA1 and OA2) and the normal area NA, as in FIGS. 1C and 1D; and the normal area NA thereof includes the normal areas NAs in FIGS. 1A, 1B, 1C, and 1D, and the first and second optical areas (OA1 and/or OA2) thereof include the first optical areas OA1s in FIGS. 1A, 1B, 1C, and 1D and the second optical areas OA2s of FIGS. 1C and 1D, respectively, unless explicitly stated otherwise.

Figure 3:
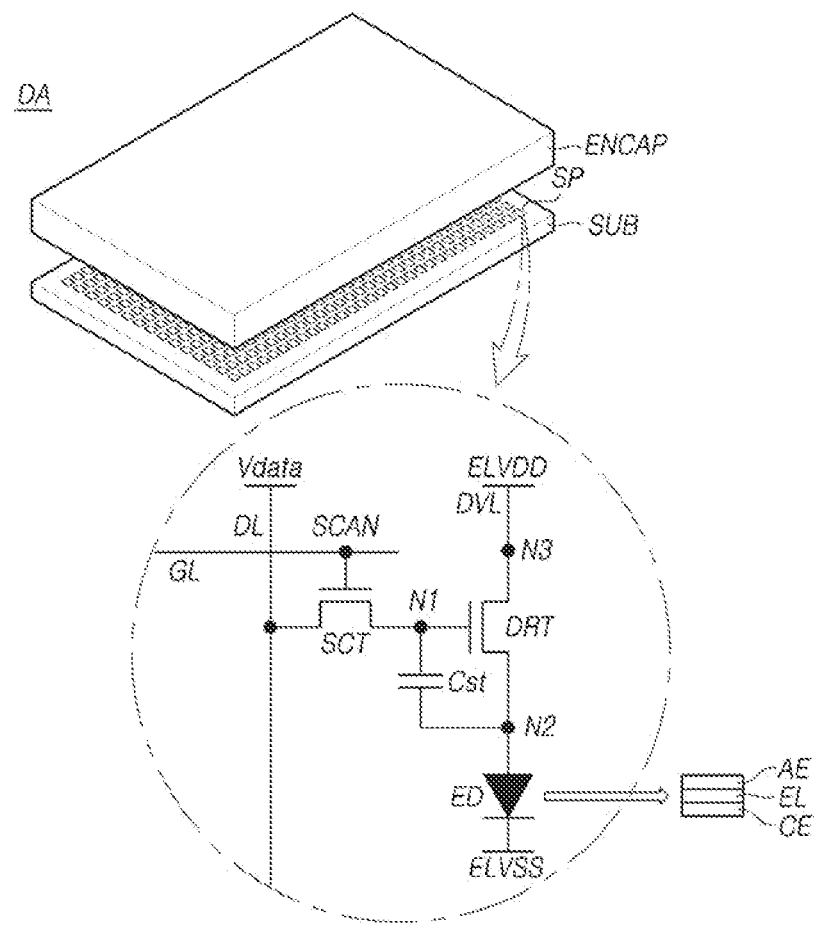
FIG. 3 illustrates an example equivalent circuit of a subpixel in a display panel according to aspects of the present disclosure.

FIG. 3 illustrates an example equivalent circuit of a subpixel SP in the display panel 110 according to aspects of the present disclosure.

Referring to FIG. 3, each of subpixels SP disposed in the normal area NA, the first optical area OA1, and the second optical area OA2 included in the display area DA of the display panel 110 can include a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like.

The driving transistor DRT can include the first node N1 to which a data voltage is applied, a second node N2 electrically connected to the light emitting element ED, and a third node N3 to which a driving voltage ELVDD through a driving voltage line DVL is applied. In the driving transistor DRT, the first node N1 can be a gate node, the second node N2 can be a source node or a drain node, and the third node N3 can be the drain node or the source node.

The light emitting element ED can include an anode electrode AE, an emission layer EL, and a cathode electrode CE. The anode electrode AE can be a pixel electrode disposed in each subpixel SP, and can be electrically connected to the second node N2 of the driving transistor DRT of each subpixel SP. The cathode electrode CE can be a common electrode commonly disposed in the plurality of subpixels SP, and a base voltage ELVSS such as a low-level voltage can be applied to the cathode electrode CE.

For example, the anode electrode AE can be the pixel electrode, and the cathode electrode CE can be the common electrode. In another example, the anode electrode AE can be the common electrode, and the cathode electrode CE can be the pixel electrode. For convenience of description, in the discussion that follows, it is assumed that the anode electrode AE is the pixel electrode, and the cathode electrode CE is the common electrode unless explicitly stated otherwise.

The light emitting element ED can be, for example, an organic light emitting diode (OLED), an inorganic light emitting diode, a quantum dot light emitting element, or the like. In the example where an organic light emitting diode is used as the light emitting element ED, the emission layer EL included in the light emitting element ED can include an organic emission layer including an organic material.

The scan transistor SCT can be turned on and off by a scan signal SCAN that is a gate signal applied through a gate line GL, and be electrically connected between the first node N1 of the driving transistor DRT and a data line DL.

The storage capacitor Cst can be electrically connected between the first node N1 and the second node N2 of the driving transistor DRT.

Each subpixel SP can include two transistors (2T: DRT and SCT) and one capacitor (1C: Cst) (which can be referred to as a "2T1C structure") as shown in FIG. 3, and in some cases, can further include one or more transistors, or further include one or more capacitors.

In some embodiments, the storage capacitor Cst, which can be present between the first node N1 and the second node N2 of the driving transistor DRT, can be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like).

Each of the driving transistor DRT and the scan transistor SCT can be an n-type transistor or a p-type transistor.

In an embodiment, each of the driving transistor DRT and the scan transistor SCT can be low-temperature polycrystalline silicon transistors. However, embodiments of the present disclosure are not limited thereto. For example, at least one of the driving transistor DRT and the scan transistor SCT can be an oxide thin film transistor.

Since circuit elements (e.g., in particular, a light emitting element ED) in each subpixel SP are vulnerable to external moisture or oxygen, an encapsulation layer ENCAP can be disposed in the display panel 110 in order to prevent the external moisture or oxygen from penetrating into the circuit elements (e.g., in particular, the light emitting element ED). The encapsulation layer ENCAP can be disposed to cover the light emitting element ED.

Figure 4A:
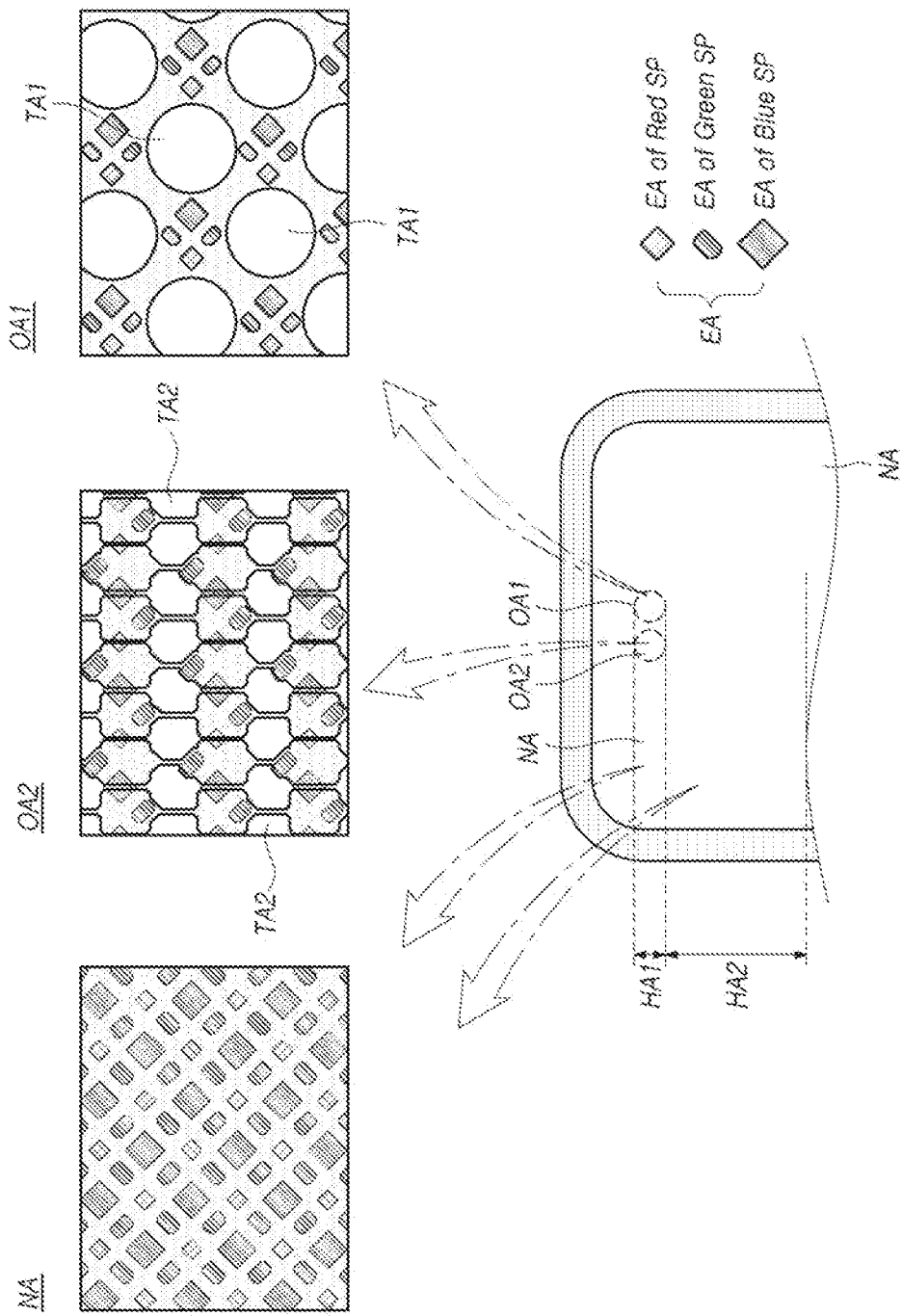
FIG. 4A illustrates example arrangements of subpixels in three areas included in a display area of the display panel according to aspects of the present disclosure.
Figure 4B:
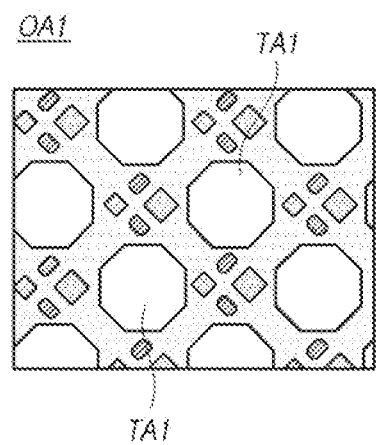
FIG. 4B illustrates another example structure of a first optical area of the display panel according to aspects of the present disclosure.

FIG. 4A illustrates example arrangements of subpixels SP in the three areas (NA, OA1, and OA2) included in the display area DA of the display panel 110 according to aspects of the present disclosure. FIG. 4B illustrates another example structure of the first optical area of the display panel 110 according to aspects of the present disclosure.

Referring to FIG. 4A, in some embodiments, a plurality of subpixels SP can be disposed in each of the normal area NA, the first optical area OA1, and the second optical area OA2 included in the display area DA.

The plurality of subpixels SP can include, for example, a red subpixel (Red SP) emitting red light, a green subpixel (Green SP) emitting green light, and a blue subpixel (Blue SP) emitting blue light.

Accordingly, each of the normal area NA, the first optical area OA1, and the second optical area OA2 can include one or more light emitting areas EA of one or more red subpixels (Red SP), one or more light emitting areas EA of one or more green subpixels (Green SP), and one or more light emitting areas EA of one or more blue subpixels (Blue SP).

Referring to FIG. 4A, in some embodiments, the normal area NA may not include a light transmission structure, but can include light emitting areas EA.

In contrast, in some embodiments, the first optical area OA1 and the second optical area OA2 need to include both the light emitting areas EA and the light transmission structure.

Accordingly, the first optical area OA1 can include one or more light emitting areas EA and one or more first transmission areas TA1, and the second optical area OA2 can include one or more light emitting areas EA and one or more second transmission areas TA2.

The light emitting areas EA and the transmission areas (TA1 and/or TA2) can be distinct according to whether the transmission of light is allowed. For example, the light emitting areas EA can be areas not allowing light to transmit (e.g., not allowing light to transmit to the back of the display panel), and the transmission areas (TA1 and/or TA2) can be areas allowing light to transmit (e.g., allowing light to transmit to the back of the display panel).

The light emitting areas EA and the transmission areas (TA1 and/or TA2) can be also distinct according to whether or not a specific metal layer is included. For example, the cathode electrode CE as shown in FIG. 3 can be disposed in the light emitting areas EA, and the cathode electrode CE may not be disposed in the transmission areas (TA1 and/or TA2). In some embodiments, a light shield layer can be disposed in the light emitting areas EA, and a light shield layer may not be disposed in the transmission areas (TA1 and/or TA2).

Since the first optical area OA1 includes the first transmission areas TA1 and the second optical area OA2 includes the second transmission areas TA2, both of the first optical area OA1 and the second optical area OA2 are areas through which light can transmit.

In one embodiment, a transmittance (a degree of transmission) of the first optical area OA1 and a transmittance (a degree of transmission) of the second optical area OA2 can be substantially equal.

For example, the first transmission area TA1 of the first optical area OA1 and the second transmission area TA2 of the second optical area OA2 can have substantially the same shape or size. In another example, even when the first transmission area TA1 of the first optical area OA1 and the second transmission area TA2 of the second optical area OA2 have different shapes or sizes, a ratio of the first transmission area TA1 to the first optical area OA1 and a ratio of the second transmission area TA2 to the second optical area OA2 can be substantially equal. In an example, each of the first transmission areas TA1s has the same shape and size. In an example, each of the second transmission areas TA2s has the same shape and size.

In another embodiment, a transmittance (a degree of transmission) of the first optical area OA1 and a transmittance (a degree of transmission) of the second optical area OA2 can be different from each other.

For example, the first transmission area TA1 of the first optical area OA1 and the second transmission area TA2 of the second optical area OA2 can have different shapes or sizes. In another example, even when the first transmission area TA1 of the first optical area OA1 and the second transmission area TA2 of the second optical area OA2 have substantially the same shape or size, a ratio of the first transmission area TA1 to the first optical area OA1 and a ratio of the second transmission area TA2 to the second optical area OA2 can be different from each other.

For example, in the example where the first optical electronic device 11, as shown in FIGS. 1A, 1B, 1C, and 1D overlapping the first optical area OA1 is a camera, and the second optical electronic device 12, as shown in FIGS. 1C and 1D, overlapping the second optical area OA2 is a sensor for detecting images, the camera can need a greater amount of light than the sensor.

Thus, the transmittance (degree of transmission) of the first optical area OA1 can be greater than the transmittance (degree of transmission) of the second optical area OA2.

For example, the first transmission area TA1 of the first optical area OA1 can have a size greater than the second transmission area TA2 of the second optical area OA2. In another example, even when the first transmission area TA1 of the first optical area OA1 and the second transmission area TA2 of the second optical area OA2 have substantially the same size, a ratio of the first transmission area TA1 to the first optical area OA1 can be greater than a ratio of the second transmission area TA2 to the second optical area OA2.

In an embodiment, as shown in FIG. 4A, the first transmission area TA1 of the first optical area OA1 can have a circular shape in a cross-sectional view, but the structure of the first transmission area TA1 according to embodiments of the present disclosure is not limited thereto.

In another embodiment, as shown in FIG. 4B, the first transmission area TA1 of the first optical area OA1 can have an octagonal shape. In some embodiments, the first transmission area TA1 of the first optical area OA1 can have an elliptical or polygonal shape.

In this manner, the transmittance of the first transmission area TA1 can be adjusted and an area or size of the light emitting area of the first optical area OA1 can be adjusted, by changing a shape of the first transmission area TA1.

For convenience of description, the discussion that follows is provided based on the embodiment in which the transmittance (degree of transmission) of the first optical area OA1 is greater than the transmittance (degree of transmission) of the second optical area OA2.

Further, the transmission areas (TA1 and/or TA2) as shown in FIG. 4A can be referred to as transparent areas, and the term transmittance can be referred to as transparency.

Further, in the discussion that follows, it is assumed that the first optical areas OA1 and the second optical areas OA2 are located in an upper edge of the display area DA of the display panel 110, and are disposed to be horizontally adjacent to each other such as being disposed in a direction in which the upper edge extends, as shown in FIG. 4A, unless explicitly stated otherwise.

Referring to FIG. 4A, a horizontal display area in which the first optical area OA1 and the second optical area OA2 are disposed is referred to as a first horizontal display area HA1 and another horizontal display area in which the first optical area OA1 and the second optical area OA2 are not disposed is referred to as a second horizontal display area HA2.

Referring to FIG. 4A, the first horizontal display area HA1 can include a portion of the normal area NA, the first optical area OA1, and the second optical area OA2. The second horizontal display area HA2 can include only another portion of the normal area NA.

FIG. 5A illustrates example arrangements of signal lines in each of the first optical area OA1 and the normal area NA of the display panel 110 according to aspects of the present disclosure, and FIG. 5B illustrates example arrangements of signal lines in each of the second optical area OA2 and the normal area NA of the display panel 110 according to aspects of the present disclosure.

First horizontal display areas HA1 shown in FIGS. 5A and 5B are portions of the first horizontal display area HA1 of the display panel 110. Second horizontal display area HA2 shown in FIGS. 5A and 5B are portions of the second horizontal display area HA2 of the display panel 110.

A first optical area OA1 shown in FIG. 5A is a portion of the first optical area OA1 of the display panel 110, and a second optical area OA2 shown in FIG. 5B is a portion of the second optical area OA2 of the display panel 110.

Referring to FIGS. 5A and 5B, the first horizontal display area HA1 can include a portion of the normal area NA, the first optical area OA1, and the second optical area OA2. The second horizontal display area HA2 can include another portion of the normal area NA.

Various types of horizontal lines (HL1 and HL2) and various types of vertical lines (VLn, VL1, and VL2) can be disposed in the display panel 110.

In some embodiments, the term "horizontal" and the term "vertical" are used to refer to two directions intersecting the display panel; however, it should be noted that the horizontal direction and the vertical direction can be changed depending on a viewing direction. The horizontal direction can refer to, for example, a direction in which one gate line GL extends and, and the vertical direction can refer to, for example, a direction in which one data line DL extends. As such, the term horizontal and the term vertical are used to represent two directions.

Referring to FIGS. 5A and 5B, the horizontal lines disposed in the display panel 110 can include first horizontal lines HL1 disposed in the first horizontal display area HA1 and second horizontal lines HL2 disposed on the second horizontal display area HA2.

The horizontal lines disposed in the display panel 110 can be gate lines GL. For example, the first horizontal lines HL1 and the second horizontal lines HL2 can be the gate lines GL. The gate lines GL can include various types of gate lines according to structures of one or more subpixels SP.

Referring to FIGS. 5A and 5B, the vertical lines disposed in the display panel 110 can include typical vertical lines VLn disposed only in the normal area NA, first vertical lines VL1 running through both of the first optical area OA1 and the normal area NA, and second vertical lines VL2 running through both of the second optical area OA2 and the normal area NA.

The vertical lines disposed in the display panel 110 can include data lines DL, driving voltage lines DVL, and the like, and can further include reference voltage lines, initialization voltage lines, and the like. For example, the typical vertical lines VLn, the first vertical lines VL1 and the second vertical lines VL2 can include the data lines DL, the driving voltage lines DVL, and the like, and can further include the reference voltage lines, the initialization voltage lines, and the like.

In some embodiments, it should be noted that the term "horizontal" in the second horizontal line HL2 can mean only that a signal is carried from a left side, to a right side, of the display panel (or from the right side to the left side), and may not mean that the second horizontal line HL2 runs in a straight line only in the direct horizontal direction. For example, in FIGS. 5A and 5B, although the second horizontal lines HL2 are illustrated in a straight line, one or more of the second horizontal lines HL2 can include one or more bent or folded portions that are different from the configurations shown in FIGS. 5A and 5B. Likewise, one or more of the first horizontal lines HL1 can also include one or more bent or folded portions.

In some embodiments, it should be noted that the term "vertical" in the typical vertical line VLn can mean only that a signal is carried from an upper portion, to a lower portion, of the display panel (or from the lower portion to the upper portion), and may not mean that the typical vertical line VLn runs in a straight line only in the direct vertical direction. For example, in FIGS. 5A and 5B, although the typical vertical lines VLn are illustrated in a straight line, one or more of the typical vertical lines VLn can include one or more bent or folded portions that are different from the configurations shown in FIGS. 5A and 5B. Likewise, one or more of the first vertical line VL1 and one or more of the second vertical line VL2 can also include one or more bent or folded portions.

Referring to FIG. 5A, the first optical area OA1 included in the first horizontal area HA1 can include light emitting areas EA, as shown in FIG. 4, and first transmission areas TA1. In the first optical area OA1, respective outer areas of the first transmission areas TA1 can include corresponding light emitting areas EA.

Referring to FIG. 5A, in order to improve the transmittance of the first optical area OA1, the first horizontal lines HL1 can run through the first optical area OA1 while avoiding the first transmission areas TA1 in the first optical area OA1.

Accordingly, each of the first horizontal lines HL1 running through the first optical area OA1 can include one or more curved or bent portions running around one or more respective outer edges of one or more of the first transmission areas TA1.

Accordingly, the first horizontal lines HL1 disposed in the first horizontal area HA1 and the second horizontal lines HL2 disposed in the second horizontal area HA2 can have different shapes or lengths. For example, the first horizontal lines HL1 running through the first optical area OA1 and the second horizontal lines HL2 not running through the first optical area OA1 can have different shapes or lengths.

Further, in order to improve the transmittance of the first optical area OA1, the first vertical lines VL1 can run through the first optical area OA1 while avoiding the first transmission areas TA1 in the first optical area OA1.

Accordingly, each of the first vertical lines VL1 running through the first optical area OA1 can include one or more curved or bent portions running around one or more respective outer edges of one or more of the first transmission areas TA1.

Thus, the first vertical lines VL1 running through the first optical area OA1 and the typical vertical lines VLn disposed in the normal area NA without running through the first optical area OA1 can have different shapes or lengths.

Referring to FIG. 5A, the first transmission areas TA1 included in the first optical area OA1 in the first horizontal area HA1 can be arranged in a diagonal direction.

Referring to FIG. 5A, in the first optical area OA1 in the first horizontal area HA1, one or more light emitting areas EA can be disposed between two horizontally adjacent first transmission areas TA1. In the first optical area OA1 in the first horizontal area HAL one or more light emitting areas EA can be disposed between two vertically adjacent first transmission areas TA1.

Referring to FIG. 5A, each of the first horizontal lines HL1 disposed in the first horizontal area HA1 (e.g., each of the first horizontal lines HL1 running through the first optical area OA1) can include one or more curved or bent portions running around one or more respective outer edges of one or more of the first transmission areas TA1.

Referring to FIG. 5B, the second optical area OA2 included in the first horizontal area HA1 can include light emitting areas EA and second transmission areas TA2. In the second optical area OA2, respective outer areas of the second transmission areas TA2 can include corresponding light emitting areas EA.

In one embodiment, the light emitting areas EA and the second transmission areas TA2 in the second optical area OA2 can have substantially the same locations and arrangements as the light emitting areas EA and the first transmission areas TA1 in the first optical area OA1 of FIG. 5A.

In another embodiment, as shown in FIG. 5B, the light emitting areas EA and the second transmission areas TA2 in the second optical area OA2 can have locations and arrangements different from the light emitting areas EA and the first transmission areas TA1 in the first optical area OA1 of FIG. 5A.

For example, referring to FIG. 5B, the second transmission areas TA2 in the second optical area OA2 can be arranged in the horizontal direction (the left to right or right to left direction). In this example, a light emitting area EA may not be disposed between two second transmission areas TA2 adjacent to each other in the horizontal direction. Further, one or more of the light emitting areas EA in the second optical area OA2 can be disposed between second transmission areas TA2 adjacent to each other in the vertical direction (the top to bottom or bottom to top direction). For example, one or more light emitting areas EA can be disposed between two rows of second transmission areas.

When in the first horizontal area HAL running through the second optical area OA2 and the normal area NA adjacent to the optical area, in one embodiment, the first horizontal lines HL1 can have substantially the same arrangement as the first horizontal lines HL1 of FIG. 5A.

In another embodiment, as shown in FIG. 5B, when in the first horizontal area HAL running through the second optical area OA2 and the normal area NA adjacent to the second optical area OA2, the first horizontal lines HL1 can have an arrangement different from the first horizontal lines HL1 of FIG. 5A.

This is because the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when in the first horizontal area HAL the first horizontal lines HL1 run through the second optical area OA2 and the normal area NA adjacent to the second optical area OA2, the first horizontal lines HL1 can run between vertically adjacent second transmission areas TA2 in a straight line without having a curved or bent portion.

For example, one first horizontal line HL1 can have one or more curved or bent portions in the first optical area OA1, but may not have a curved or bent portion in the second optical area OA2.

In order to improve the transmittance of the second optical area OA2, the second vertical lines VL2 can run through the second optical area OA2 while avoiding the second transmission areas TA2 in the second optical area OA2.

Accordingly, each of the second vertical lines VL2 running through the second optical area OA2 can include one or more curved or bent portions running around one or more respective outer edges of one or more of the second transmission areas TA2.

Thus, the second vertical lines VL2 running through the second optical area OA2 and the typical vertical lines VLn disposed in the normal area NA without running through the second optical area OA2 can have different shapes or lengths.

As shown in FIG. 5A, each, or one or more, of the first horizontal lines HL1 running through the first optical area OA1 can have one or more curved or bent portions running around one or more respective outer edges of one or more of the first transmission areas TA1.

A length of the first horizontal line HL1 running through the first optical area OA1 and the second optical area OA2 can be slightly longer than a length of the second horizontal line HL2 disposed only in the normal area NA without running through the first optical area OA1 and the second optical area OA2.

Accordingly, a resistance of the first horizontal line HL1 running through the first optical area OA1 and the second optical area OA2, which is referred to as a first resistance, can be slightly greater than a resistance of the second horizontal line HL2 disposed only in the normal area NA without running through the first optical area OA1 and the second optical area OA2, which is referred to as a second resistance.

Referring to FIGS. 5A and 5B, according to a light transmitting structure, since the first optical area OA1 that at least partially overlaps the first optical electronic device 11 includes the first transmitting areas TA1, and the second optical area OA2 that at least partially overlaps with the second optical electronic device 12 includes the second transmission areas TA2, therefore, the first optical area OA1 and the second optical area OA2 can have the number of subpixels per unit area smaller than the non-optical area NA.

Accordingly, the number of subpixels connected to each, or one or more, of the first horizontal lines HL1 running through the first optical area OA1 and the second optical area OA2 can be different from the number of subpixels connected to each, or one or more, of the second horizontal lines HL2 disposed only in the normal area NA without running through the first optical area OA1 and the second optical area OA2.

The number of subpixels connected to each, or one or more, of the first horizontal lines HL1 running through the first optical area OA1 and the second optical area OA2, which is referred to as a first number, can be less than the number of subpixels connected to each, or one or more, of the second horizontal lines HL2 disposed only in the normal area NA without running through the first optical area OA1 and the second optical area OA2, which is referred to as a second number.

A difference between the first number and the second number can vary according to a difference between a resolution of each of the first optical area OA1 and the second optical area OA2 and a resolution of the normal area NA. For example, as a difference between a resolution of each of the first optical area OA1 and the second optical area OA2 and a resolution of the normal area NA increases, a difference between the first number and the second number can increase.

As described above, since the number (the first number) of subpixels connected to each, or one or more, of the first horizontal lines HL1 running through the first optical area OA1 and the second optical area OA2 is less than the number of subpixels (second number) connected to each, or one or more, of the second horizontal lines HL2 disposed only in the normal area NA without running through the first optical area OA1 and the second optical area OA2, an area where the first horizontal line HL1 overlaps one or more other electrodes or lines adjacent to the first horizontal line HL1 can be smaller than an area where the second horizontal line HL2 overlaps one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, can be greatly smaller than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≥the second resistance) and a relationship in magnitude between the first capacitance and the second capacitance (the first capacitance<<second capacitance), a resistance-capacitance (RC) value of the first horizontal line HL1 running through the first optical area OA1 and the second optical area OA2, which is referred to as a first RC value, can be greatly less than an RC value of the second horizontal lines HL2 disposed only in the normal area NA without running through the first optical area OA1 and the second optical area OA2, which is referred to as a second RC value. Thus, in this example, the first RC value is greatly smaller than the second RC value (i.e., the first RC value<<the second RC value).

Due to such a difference between the first RC value of the first horizontal line HL1 and the second RC value of the second horizontal line HL2, which is referred to as an RC load difference, a signal transmission characteristic through the first horizontal line HL1 can be different from a signal transmission characteristic through the second horizontal line HL2.

Figure 6A:
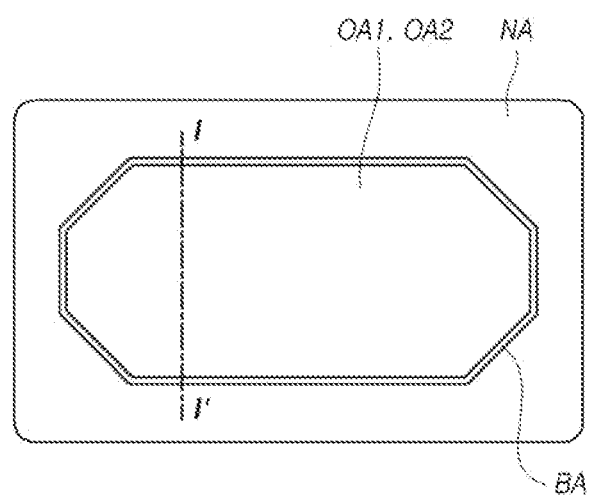
FIGS. 6A and 6B are an example plan view and an example cross-sectional view schematically illustrating a display area of the display panel according to aspects of the present disclosure.
Figure 6B:
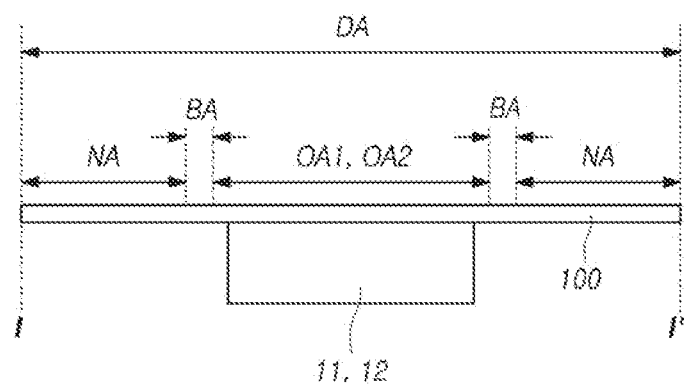

FIGS. 6A and 6B are an example plan view and an example cross-sectional view schematically illustrating a display area (e.g., the display area DA in the figures discussed above) of the display panel 110 according to aspects of the present disclosure.

Referring to FIGS. 6A and 6B, in some embodiments, a boundary area BA can be disposed between a normal area (e.g., the normal area NA in the figures discussed above) and one or more optical areas (the first optical area OA1 and/or the second optical area OA2 in the figures discussed above) in the display area DA. The display area DA can be defined as including a first area, a second area, and a third area. The first area can surround the third area, and the second area can be disposed between the first area and the third area. The first area can be the normal area NA, the second area can be the boundary area BA, and the third area can include one or more optical areas (OA1 and/or OA2). Hereinafter, for convenience of description, the first area is referred to as the normal area NA, the second area is referred to as the boundary area BA, and the third area is referred to as the one or more optical areas (OA1 and/or OA2).

The normal area NA is an area occupying the largest proportion in the display area DA, and can have a predetermined first resolution. The normal area NA can be configured with a high density of unit pixels, and thus, have a high pixels per inch (PPI).

The boundary area BA can have a second resolution lower than the first resolution. A unit pixel in the boundary area BA can be a pixel type in which one of a plurality of subpixels included in a unit pixel in the normal area NA is removed. For example, in an example where the unit pixel of the normal area NA includes one red subpixel, two green subpixels, and one blue subpixel, the unit pixel of the boundary area BA can include one red subpixel, one green subpixel and one blue subpixel.

The one or more optical areas (OA1 and/or OA2) can include an area overlapping the one or more optical electronic devices (11 and/or 12) disposed under, the back or in a lower portion of, the display panel 110. The one or more optical areas (OA1 and/or OA2) can include one or more light emitting areas (one or more light emitting areas EA in the figures discussed above) and one or more transmission areas (one or more first transmission areas TA1 and/or one or more second transmission areas TA2 in the figures discussed above) for allowing light to transmit. The one or more optical areas (OA1 and/or OA2) can have a pixel arrangement structure configured to have a lower PPI, and thus, have a lower pixel density, compared to the normal area NA and the boundary area BA. For example, the one or more optical areas (OA1 and/or OA2) can have a third resolution lower than the second resolution. A unit pixel disposed in a light emitting area of the one or more optical areas (OA1 and/or OA2) can correspond to a unit pixel of the normal area NA. For example, in an example where the unit pixel of the normal area NA includes one red subpixel, two green subpixels, and one blue subpixel, the unit pixel of the one or more optical areas (OA1 and/or OA2) can include one red subpixel, two green subpixels, and one blue subpixel.

The one or more optical electronic devices (11 and/or 12) overlapping the one or more optical areas (OA1 and/or OA2) can receive light being incident or emitted through the transmission areas (TA1 and/or TA2) ensuring a sufficient transmittance. In an embodiment, in order to increase a light transmittance, an area of each, or the whole, of the one or more transmission areas (TA1 and/or TA2) can be larger than an area of each, or the whole, of the one or more light emitting areas EA. As shown in FIG. 1D, a size of each, or the whole, of the one or more optical areas (OA1 and/or OA2) can be larger than a size of each, or the whole, of the one or more optical electronic devices (11 and/or 12).

In an embodiment, the one or more optical electronic devices (11 and/or 12) can be a camera, or a sensor, but are not limited thereto. For example, the one or more optical electronic devices (11 and/or 12) can include at least one of various optical sensors such as an infrared sensor, an illuminance sensor, an RGB sensor, or a fingerprint sensor.

In some embodiments, the number of the one or more optical areas (OA1 and/or OA2) disposed in the display area DA can be variously changed, and the shape thereof can also be variously changed. For example, the one or more optical areas (OA1 and/or OA2) can have a circular, elliptical, or polygonal structure. For example, according to shapes of the one or more optical areas (OA1 and/or OA2), a boundary area BA can have a circular, elliptical, or polygonal structure.

Figure 7A:
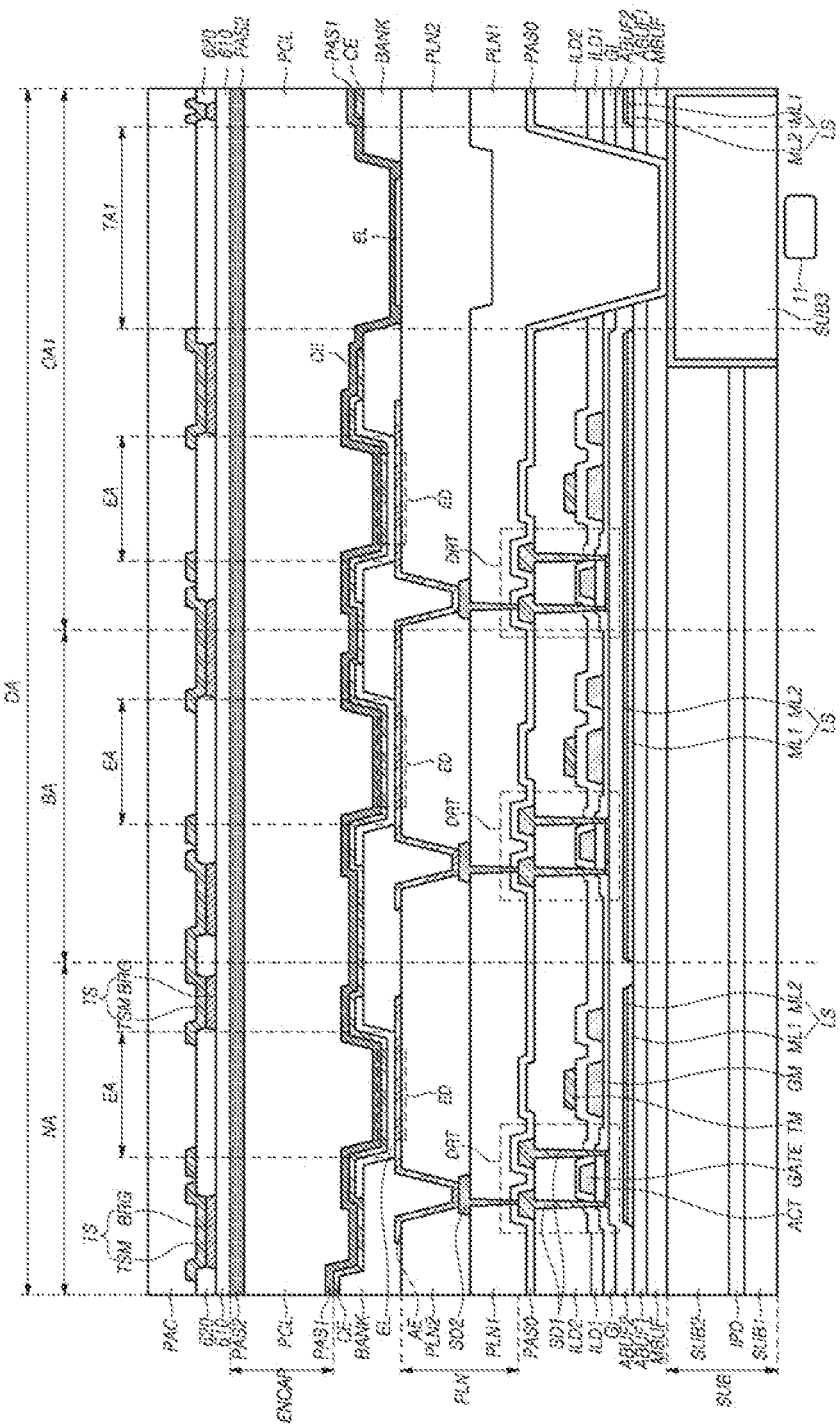
FIGS. 7A and 7B are example cross-sectional views of each of a normal area, a boundary area, a first optical area, and a second optical area included in the display area of the display panel according to aspects of the present disclosure.
Figure 7B:
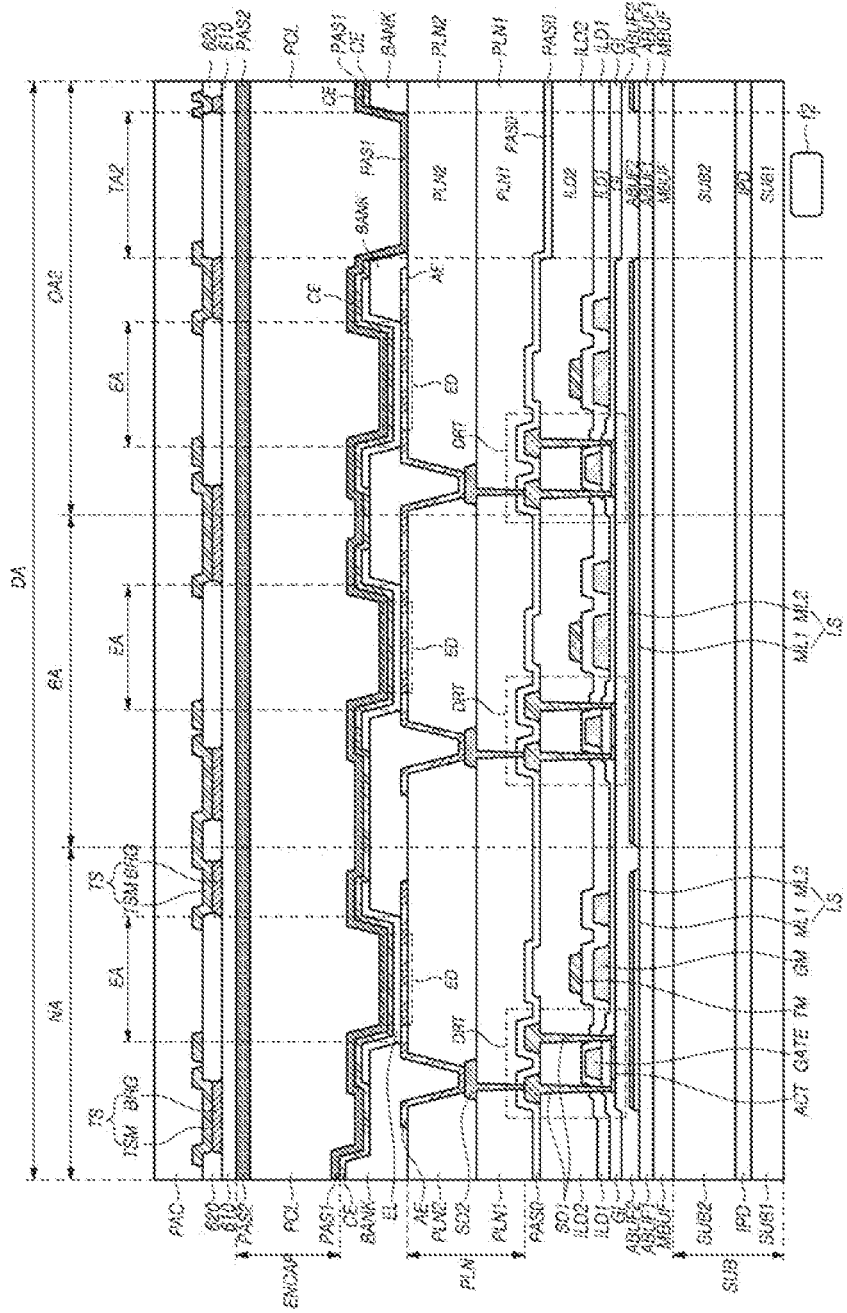

FIGS. 7A and 7B are example cross-sectional views of each of a normal area (e.g., the normal area NA in the figures discussed above), a boundary area (e.g., the boundary area BA in FIGS. 6A and 6B), a first optical area (e.g., the first optical area OA1 in the figures discussed above), and a second optical area (e.g., the second optical area in the figures discussed above) included in a display area (e.g., the display area DA in the figures discussed above) of the display panel 110 according to aspects of the present disclosure.

First, a stack structure of the normal area NA will be described with reference to FIGS. 7A and 7B. Respective light emitting areas EA of the first optical area OA1 and the second optical area OA2 can have the same stack structure as a light emitting area EA of the normal area NA.

Referring to FIGS. 7A and 7B, a substrate SUB can include a first substrate SUB1, an interlayer insulating layer IPD, and a second substrate SUB2. The interlayer insulating layer IPD can be interposed between the first substrate SUB1 and the second substrate SUB2. As the substrate SUB includes the first substrate SUB1, the interlayer insulating layer IPD, and the second substrate SUB2, the substrate SUB can prevent or reduce the penetration of moisture. The first substrate SUB1 and the second substrate SUB2 can be, for example, polyimide (PI) substrates. The first substrate SUB1 can be referred to as a primary PI substrate, and the second substrate SUB2 can be referred to as a secondary PI substrate. Furthermore, the substrate SUB may further include a third substrate SUB3 disposed over the first optical electronic device 11. The third substrate SUB3 may overlap the first optical electronic device 11. In the area of the transmission area TA, the substrate SUB3 can be used having a higher light transmission rate than the first substrate SUB1 and the second substrate SUB2.

Referring to FIGS. 7A and 7B, various types of patterns ACT, SD1, GATE, for disposing one or more transistors such as a driving transistor DRT, and the like, various types of insulating layers MBUF, ABUF1, ABUF2, GI, ILD1, ILD2, PAS0, and various types of metal patterns TM, GM, ML1, ML2 can be disposed on or over the substrate SUB.

Referring to FIGS. 7A and 7B, a multi-buffer layer MBUF can be disposed on the second substrate SUB2, and a first active buffer layer ABUF1 can be disposed on the multi-buffer layer MBUF.

A first metal layer ML1 and a second metal layer ML2 can be disposed on the first active buffer layer ABUF1. The first metal layer ML1 and the second metal layer ML2 can be, for example, light shield layers LS for shielding light.

A second active buffer layer ABUF2 can be disposed on the first metal layer ML1 and the second metal layer ML2. An active layer ACT of the driving transistor DRT can be disposed on the second active buffer layer ABUF2.

A gate insulating layer GI can be disposed to cover the active layer ACT.

A gate electrode GATE of the driving transistor DRT can be disposed on the gate insulating layer GI. Further, a gate material layer GM can be disposed on the gate insulating layer GI, together with the gate electrode GATE of the driving transistor DRT, at a location different from the location where the driving transistor DRT is disposed.

A first interlayer insulating layer ILD1 can be disposed to cover the gate electrode GATE and the gate material layer GM. A metal pattern TM can be disposed on the first interlayer insulating layer ILD1. The metal pattern TM can be located at a location different from the location where the driving transistor DRT is formed. A second interlayer insulating layer ILD2 can be disposed to cover the metal pattern TM on the first interlayer insulating layer ILD1.

Two first source-drain electrode patterns SD1 can be disposed on the second interlayer insulating layer ILD2. One of the two first source-drain electrode patterns SD1 can be a source node of the driving transistor DRT, and the other can be a drain node of the driving transistor DRT.

The two first source-drain electrode patterns SD1 can be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE can serve as a channel region. One of the two first source-drain electrode patterns SD1 can be connected to the first side portion of the channel region of the active layer ACT, and the other of the two first source-drain electrode patterns SD1 can be connected to the second side portion of the channel region of the active layer ACT.

A passivation layer PAS0 may be disposed to cover the two first source-drain electrode patterns SD1. A planarization layer PLN can be disposed on the passivation layer PAS0. The planarization layer PLN can include a first planarization layer PLN1 and a second planarization layer PLN2.

The first planarization layer PLN1 can be disposed on the passivation layer PAS0.

A second source-drain electrode pattern SD2 can be disposed on the first planarization layer PLN1. The second source-drain electrode pattern SD2 can be connected to one of the two first source-drain electrode patterns SD1 (corresponding to the second node N2 of the driving transistor DRT in the subpixel SP of FIG. 3) through a contact hole formed in the first planarization layer PLN1.

The second planarization layer PLN2 can be disposed to cover the second source-drain electrode pattern SD2. A light emitting element ED can be disposed on the second planarization layer PLN2.

According to an example stack structure of the light emitting element ED, an anode electrode AE can be disposed on the second planarization layer PLN2. The anode electrode AE can be electrically connected to the second source-drain electrode pattern SD2 through a contact hole formed in the second planarization layer PLN2.

A bank BANK can be disposed to cover a portion of the anode electrode AE. A portion of the bank BANK corresponding to a light emitting area EA of the subpixel SP can be opened.

A portion of the anode electrode AE can be exposed through the opening (the opened portion) of the bank BANK. An emission layer EL can be positioned on side surfaces of the bank BANK and in the opening (the opened portion) of the bank BANK. All or at least a portion of the emission layer EL can be located between adjacent banks.

In the opening of the bank BANK, the emission layer EL can contact the anode electrode AE. A cathode electrode CE can be disposed on the emission layer EL.

The light emitting element ED can be formed by including the anode electrode AE, the emission layer EL, and the cathode electrode CE, as described above. The emission layer EL can include an organic material layer.

An encapsulation layer ENCAP can be disposed on the stack of the light emitting element ED.

The encapsulation layer ENCAP can have a single-layer structure or a multi-layer structure For example, as shown in FIGS. 7A and 7B, the encapsulation layer ENCAP can include a first encapsulation layer PAS1, a second encapsulation layer PCL, and a third encapsulation layer PAS2.

The first encapsulation layer PAS1 and the third encapsulation layer PAS2 can be, for example, an inorganic material layer, and the second encapsulation layer PCL can be, for example, an organic material layer. Among the first encapsulation layer PAS1, the second encapsulation layer PCL, and the third encapsulation layer PAS2, the second encapsulation layer PCL can be the thickest and serve as a planarization layer.

The first encapsulation layer PAS1 can be disposed on the cathode electrode CE and can be disposed closest to the light emitting element ED. The first encapsulation layer PAS1 can include an inorganic insulating material capable of being deposited using low-temperature deposition. For example, the first encapsulation layer PAS1 can include, but not limited to, silicon nitride (SiNx), silicon oxide (SiOx), silicon oxynitride (SiON), aluminum oxide ($Al_2O_3$), or the like. Since the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL can have a smaller area or size than the first encapsulation layer PAS1. For example, the second encapsulation layer PCL can be disposed to expose both ends or edges of the first encapsulation layer PAS1. The second encapsulation layer PCL can serve as a buffer for relieving stress between corresponding layers while the display device 100 is curved or bent, and also serve to enhance planarization performance. For example, the second encapsulation layer PCL can include an organic insulating material, such as acrylic resin, epoxy resin, polyimide, polyethylene, silicon oxycarbon (SiOC), or the like. The second encapsulation layer PCL can be disposed, for example, using an inkjet scheme.

The third encapsulation layer PAS2 can be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can minimize or prevent external moisture or oxygen from penetrating into the first encapsulation layer PAS1 and the second encapsulation layer PCL. For example, the third encapsulation layer PAS2 can include an inorganic insulating material, such as silicon nitride (SiNx), silicon oxide (SiOx), silicon oxynitride (SiON), aluminum oxide ($Al_2O_3$), or the like.

In an example, a touch sensor TS can be disposed on the encapsulation layer ENCAP. The structure of the touch sensor will be described in detail as follows.

A touch buffer layer 610 can be disposed on the encapsulation layer ENCAP. The touch sensor TS can be disposed on the touch buffer layer 610.

The touch sensor TS can include touch sensor metals TSM and at least one bridge metal BRG, which are located in different layers.

A touch interlayer insulating layer 620 can be disposed between the touch sensor metals TSM and the bridge metal BRG.

For example, the touch sensor metals TSM can include a first touch sensor metal TSM, a second touch sensor metal TSM, and a third touch sensor metal TSM, which are disposed adjacent to one another. In an embodiment where the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM can be electrically connected to each other through the bridge metal BRG located in a different layer. The bridge metal BRG can be electrically insulated from the third touch sensor metal TSM by the touch interlayer insulating layer 620.

While the touch sensor TS is disposed on the display panel 110, a chemical solution (e.g., a developer or etchant) used in the corresponding process or moisture from the outside can be generated or introduced. In some embodiments, by disposing the touch sensor TS on the touch buffer layer 610, a chemical solution or moisture can be prevented from penetrating into the emission layer EL including an organic material during the manufacturing process of the touch sensor TS. Accordingly, the touch buffer layer 610 can prevent damage to the emission layer EL, which is vulnerable to a chemical solution or moisture.

In order to prevent damage to the emission layer EL including an organic material, which is vulnerable to high temperatures, the touch buffer layer 610 can be formed at a low temperature less than or equal to a predetermined temperature (e.g. 100 degrees (° C.)) and be formed using an organic insulating material having a low permittivity of 1 to 3. For example, the touch buffer layer 610 can include an acrylic-based, epoxy-based, or siloxan-based material. As the display device 100 is bent, the encapsulation layer ENCAP can be damaged, and the touch sensor metal located on the touch buffer layer 610 can be cracked or broken. Even when the display device 100 is bent, the touch buffer layer 610 including the organic insulating material and having the planarization performance can prevent the damage of the encapsulation layer ENCAP and/or the cracking or breaking of the metals (TSM, BRG) included in the touch sensor TS.

A protective layer PAC can be disposed to cover the touch sensor TS. The protective layer PAC can be, for example, an organic insulating layer.

In the normal area NA, a thickness T1 of the first insulating layer 610 is smaller than a thickness T2 of the second insulating layer 620.

Next, a stack structure of the first optical area OA1 will be described with reference to FIGS. 7A and 7B.

Referring to FIGS. 7A and 7B, a light emitting area EA of the first optical area OA1 can have the same stack structure as a light emitting area EA of the normal area NA. Accordingly, in the discussion that follows, instead of repeatedly describing the light emitting area EA of the first optical area OA1, a stack structure of the first transmission area TA1 of the first optical area OA1 will be described in detail below.

In some embodiments, the cathode electrode CE can be disposed in the light emitting areas EA included in the normal area NA and the first optical area OA1, but may not be disposed in the first transmission area TA1 in the first optical area OA1. For example, the first transmission area TA1 of the first optical area OA1 can correspond to an opening of the cathode electrode CE.

Further, in some embodiments, a light shield layer LS including at least one of the first metal layer ML1 and the second metal layer ML2 can be disposed in the light emitting areas EA included in the normal area NA and the first optical area OA1, but may not be disposed in the first transmission area TA1 of the first optical area OA1. For example, the first transmission area TA1 of the first optical area OA1 can correspond to an opening of the light shield layer LS.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), 610, 620, PAC) disposed in the light emitting areas EA included in the normal area NA and the first optical area OA1 can be disposed in the first transmission area TA1 in the first optical area OA1 equally, substantially equally, or similarly.

However, in some embodiments, all or one or more of one or more material layers having electrical properties (e.g., one or more metal material layers, and/or one or more semiconductor layers), except for the insulating materials or layers, disposed in the light emitting areas EA included in the normal area NA and the first optical area OA1 may not be disposed in the first transmission area TA1 in the first optical area OA1.

For example, referring to FIGS. 7A and 7B, all, or one or more, of the metal material layers (ML1, ML2, GATE, GM, TM, SD1, SD2) and the semiconductor layer ACT, which are related to at least one transistor, may not be disposed in the first transmission area TA1.

Further, referring to FIGS. 7A and 7B, in some embodiments, the anode electrode AE and the cathode electrode CE included in the light emitting element ED may not be disposed in the first transmission area TA1. In some embodiments, the emission layer EL of the light emitting element ED may or may not be disposed in the first transmission area TA1 according to a design requirement.

Further, referring to FIGS. 7A and 7B, in some embodiments, the touch sensor metal TSM and the bridge metal BRG included in the touch sensor TS may not be disposed in the first transmission area TA1 of the first optical area OA1.

Accordingly, the light transmittance of the first transmission area TA1 in the first optical area OA1 can be provided or improved because the material layers (e.g., one or more metal material layers, and/or one or more semiconductor layers) having electrical properties are not disposed in the first transmission area TA1 in the first optical area OA1. As a consequence, the first optical electronic device 11 can perform a predefined function (e.g., image sensing) by receiving light transmitting through the first transmission area TA1.

In some embodiments, since all, or one or more, of the first transmission area TA1 in the first optical area OA1 overlap the first optical electronic device 11, to enable the first optical electronic device 11 to normally operate, it is desired to further increase a transmittance of the first transmission area TA1 in the first optical area OA1.

To achieve the foregoing, in the display panel 110 of the display device 100 according to aspects of the present disclosure, a transmittance improvement structure TIS can be provided to the first transmission area TA1 of the first optical area OA1.

Referring to FIGS. 7A and 7B, the plurality of insulating layers included in the display panel 110 can include at least one buffer layer (MBUF, ABUF1, ABUF2) between at least one substrate (SUB1, SUB2) and at least one transistor (DRT, SCT), at least one planarization layers (PLN1, PLN2) between the transistor DRT and the light emitting element ED, at least one encapsulation layer ENCAP on the light emitting element ED, and the like.

The plurality of insulating layers included in the display panel 110 can further include the touch buffer layer 610, the touch interlayer insulating layer 620 located on the encapsulation layer ENCAP, and the like.

Referring to FIGS. 7A and 7B, the first transmission area TA1 of the first optical area OA1 can have a structure in which the first planarization layer PLN1 and the passivation layer PAS0 have depressed portions that extend downward from respective surfaces thereof as a transmittance improvement structure TIS.

Referring to FIGS. 7A and 7B, among the multiple of insulating layers, the first planarization layer PLN1 can include at least one depression (e.g., a recess, a trench, a concave portion, a protrusion, or the like). The first planarization layer PLN1 can be, for example, an organic insulating layer.

In the example where the first planarization layer PLN1 has the depressed portion that extends downward from the surfaces thereof, the second planarization layer PLN2 can substantially serve to provide planarization. In one embodiment, the second planarization layer PLN2 can also have a depressed portion that extends downward from the surface thereof. In this embodiment, the second encapsulation layer PCL can substantially serve to provide planarization.

Referring to FIGS. 7A and 7B, the depressed portions of the first planarization layer PLN1 and the passivation layer PAS0 can pass through insulating layers, such as the first interlayer insulating layer ILD, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2.

Referring to FIGS. 7A and 7B, the substrate SUB can include at least one concave portion or depressed portion as a transmittance improvement structure TIS. For example, in the first transmission area TA1, an upper portion of the second substrate SUB2 can be indented or depressed downward, or the second substrate SUB2 can be perforated.

Referring to FIGS. 7A and 7B, the first encapsulation layer PAS1 and the second encapsulation layer PCL included in the encapsulation layer ENCAP can also have a transmittance improvement structure TIS in which the first encapsulation layer PAS1 and the second encapsulation layer PCL have depressed portions that extend downward from the respective surfaces thereof. The second encapsulation layer PCL can be, for example, an organic insulating layer.

In some embodiments, the substrate SUB may not include a concave portion in the first transmission area TA1, and the first encapsulation layer PAS1 and the second encapsulation layer PCL included in the encapsulation layer ENCAP can also have a flat surface or a flat shape.

To protect the touch sensor TS, the protective layer PAC can be disposed to cover the touch sensor TS on the encapsulation layer ENCAP.

The protective layer PAC can have at least one depression (e.g., a recess, a trench, a concave portion, a protrusion, or the like) as a transmittance improvement structure TIS in a portion overlapping the first transmission area TA1. The protective layer PAC can be, for example, an organic insulating layer.

The touch sensor TS can include one or more touch sensor metals TSM with a mesh type. In the example where the touch sensor metal TSM is formed in the mesh type, a plurality of openings can be formed in the touch sensor metal TSM. Each of the plurality of openings can be located to correspond to the light emitting area EA of the subpixel SP.

In order for the first optical area OA1 to have a transmittance greater than the normal area NA, an area or size of the touch sensor metal TSM per unit area in the first optical area OA1 can be smaller than an area or size of the touch sensor metal TSM per unit area in the normal area NA.

In some embodiments, the touch sensor TS can be disposed in the light emitting area EA of the first optical area OA1, but may not be disposed in the first transmission area TA1 of the first optical area OA1.

In some embodiments, as shown in FIGS. 7A and 7B, in order that the transmittance of the first optical area OA1 can be higher than that of the normal area NA, a thickness T3 of the first insulating layer 610 disposed in the first optical area OA1 can be smaller than a thickness T1 of the first insulating layer 610 disposed in the normal area NA, and a thickness T4 of the second insulating layer 620 disposed in the first optical area OA1 can be smaller than a thickness T2 of the second insulating layer 620 disposed in the normal area NA.

The boundary area BA can have the same stacked structure as that of the normal area EA. Next, a stack structure of the second optical area OA2 will be described with reference to FIGS. 7A and 7B.

Referring to FIGS. 7A and 7B, a light emitting area EA of the second optical area OA2 can have the same stack structure as a light emitting area EA of the normal area NA. Accordingly, in the discussion that follows, instead of repeatedly describing the light emitting area EA in the second optical area OA2, a stack structure of the second transmission area TA2 in the second optical area OA2 will be described in detail below.

In some embodiments, the cathode electrode CE can be disposed in the light emitting areas EA included in the normal area NA and the second optical area OA2, but may not be disposed in the second transmission area TA2 in the second optical area OA2. For example, the second transmission area TA2 in the second optical area OA2 can be corresponded to an opening of the cathode electrode CE.

In an embodiment, the light shield layer LS including at least one of the first metal layer ML1 and the second metal layer ML2 can be disposed in the light emitting areas EA included in the non-optical area NA and the second optical area OA2, but may not be disposed in the second transmission area TA2 in the second optical area OA2. For example, the second transmission area TA2 in the second optical area OA2 can be corresponded to an opening of the light shield layer LS.

In an example where the transmittance of the second optical area OA2 and the transmittance of the first optical area OA1 are the same, the stack structure of the second transmission area TA2 in the second optical area OA2 can be the same as the stacked structure of the first transmission area TA1 in the first optical area OA1.

In another example where the transmittance of the second optical area OA2 and the transmittance of the first optical area OA1 are different, the stack structure of the second transmission area TA2 in the second optical area OA2 can be different at least in part from as the stacked structure of the first transmission area TA1 in the first optical area OA1.

For example, as shown in FIGS. 7A and 7B, in an example where the transmittance of the second optical area OA2 is lower than the transmittance of the first optical area OA1, the second transmission area TA2 in the second optical area OA2 may not have a transmittance improvement structure TIS. As a result, the first planarization layer PLN1 and the passivation layer PAS0 may not be indented or depressed. In an embodiment, a width of the second transmission area TA2 in the second optical area OA2 can be smaller than a width of the first transmission area TA1 in the first optical area OA1.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), 610, 620, PAC) disposed in the light emitting areas EA included in the normal area NA and the first optical area OA2 can be disposed in the second transmission area TA2 of the second optical area OA2 equally, substantially equally, or similarly.

However, in some embodiments, all, or one or more, of one or more material layers having electrical properties (e.g., one or more metal material layers, and/or optical area semiconductor layers), except for the insulating materials or layers, disposed in the light emitting areas EA included in the normal area NA and the second optical area OA2 may not be disposed in the second transmission area TA2 in the second optical area OA2.

For example, referring to FIGS. 7A and 7B, all, or one or more, of the metal material layers (ML1, ML2, GATE, GM, TM, SD1, SD2) related to at least one transistor and the semiconductor layer ACT may not be disposed in the second transmission area TA2 in the second optical area OA2.

Further, referring to FIGS. 7A and 7B, in some embodiments, the anode electrode AE and the cathode electrode CE included in the light emitting element ED may not be disposed in the second transmission area TA2. In some embodiments, the emission layer EL of the light emitting element ED may or may not be disposed on the second transmission area TA2 according to a design requirement.

The touch sensor metal TSM and the bridge metal BRG included in the touch sensor TS may not be disposed in the second transmission area TA2 in the second optical area OA2.

Accordingly, the light transmittance of the second transmission area TA2 in the second optical area OA2 can be provided or improved because the material layers (e.g., one or more metal material layers, and/or one or more semiconductor layers) having electrical properties are not disposed in the second transmission area TA2 in the second optical area OA2. As a consequence, the second optical electronic device 12 can perform a predefined function (e.g., detecting an object or human body, or an external illumination detection) by receiving light transmitting through the second transmission area TA2.

FIG. 8 illustrates a light shield layer LS disposed in a display area (the display area DA in the figures discussed above) of the display panel 110 according to aspects of the present disclosure.

Referring to FIG. 8, the light shield layer LS can be disposed in a normal area (e.g., the normal area NA in the figures discussed above), a boundary area (e.g., the boundary area BA in the figures discussed above), a first optical area (e.g., the first optical area OA1 in the figures discussed above), and a second optical area (e.g., the second optical area OA2 in the figures discussed above).

A plurality of transmission areas (e.g., one or more first transmission areas TA1 and/or one or more second transmission areas TA2 in the figures discussed above) can be disposed in the first optical area OA1 and the second optical area OA2 to have a predefined level of transmittance.

To achieve the foregoing, a cathode electrode CE may not be disposed in the plurality of transmission areas (TA1 and TA2) of the first optical area OA1 and the second optical area OA2. For example, a plurality of transmission areas (TA1 and TA2) can be formed through a laser patterning process in at least a portion of the first optical area OA1 and the second optical area OA2.

A light shield layer LS can be disposed to protect a driving transistor DRT disposed in the display area DA from a laser beam being incident from under the display area DA during the laser patterning process.

In an example where the display panel 110 is implemented as a transparent display, the normal area NA is needed to have a transmittance of a predefined level or more, and to achieve this, the light shield layer LS can be disposed only under the driving transistor DRT.

In this regard, as the boundary area BA is adjacent to the first optical area OA1 and the second optical area OA2 in which the plurality of transmission areas TA1 and TA2 are formed, in a situation where the light shield layer LS is disposed only under the driving transistor DRT, the driving transistor DRT can be affected due to diffraction (i.e., light diffraction phenomenon) of a laser beam incident to a portion where the light shield layer LS is not disposed during the laser patterning process. As a result, a defect in the driving transistor DRT in which the threshold voltage of the driving transistor DRT shifts can occur, and in turn, a corresponding light emitting device ED can erroneously emit light.

Accordingly, the light shield layer LS can be disposed in the entire area of the boundary area BA to prevent a defect in the driving transistor DRT due to the laser patterning process.

The light shield layer LS of the boundary area BA can be formed by the extending of the light shield layer LS of the first optical area OA1 and the second optical area OA2. For example, the light shield layer LS of the first optical area OA1 and the second optical area OA2 can continually extend up to the boundary area BA to form the light shield layer LS of the boundary area BA.

Since the light shield layer LS is formed in the entire area of the boundary area BA, even when a laser beam is irradiated to the first optical area OA1 and the second optical area OA2 to form the plurality of transmission areas TA1 and TA2. The driving transistor DRT of the boundary area BA cannot be affected by light diffraction.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. Although the exemplary embodiments have been described for illustrative purposes, a person skilled in the art will appreciate that various modifications and applications are possible without departing from the essential characteristics of the present disclosure. For example, the specific components of the exemplary embodiments can be variously modified. The above description and the accompanying drawings provide an example of the technical idea of the present invention for illustrative purposes only. For example, the disclosed embodiments are intended to illustrate the scope of the technical idea of the present disclosure.

Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present invention.

What is claimed is:

1. A display device comprising:
   a display panel comprising a display area comprising a first area and a third area surrounded by the first area, wherein the third area comprises a plurality of light emitting areas and a plurality of transmission areas; and
   an optical electronic device disposed under, or in a lower portion of, the display panel and overlapping at least a portion of the third area included in the display area,
   wherein the display panel comprises a light shield layer disposed under transistors in the plurality of light emitting areas and not disposed in the plurality of transmission areas.

2. The display device according to claim 1, wherein the display area further comprises a second area disposed between the first area and the third area,
   the display panel further comprises a non-display area adjacent to the display area, and
   the light shield layer is disposed in an entire area of the second area.

3. The display device according to claim 2, wherein the light shield layer is continuously disposed from the second area to the third area.

4. The display device according to claim 2, wherein: the first area corresponds to a first resolution,
   the second area corresponds to a second resolution lower than the first resolution, and
   the third area corresponds to a third resolution lower than the second resolution.

5. The display device according to claim 1, wherein each of a plurality of subpixels disposed in the display area includes a driving transistor and at least one scan transistor.

6. The display device according to claim 5, wherein each of the at least one scan transistor is an oxide thin film transistor.

7. The display device according to claim 5, wherein the light shield layer is disposed under the driving transistor in the first area.

8. The display device according to claim 1, wherein the third area comprises a first optical area and a second optical area, and
   wherein a first optical electronic device is disposed under the first optical area, and a second optical electronic device is disposed under the second optical area.

9. The display device according to claim 8, wherein the first optical electronic device includes a camera.

10. The display device according to claim 8, wherein the second optical electronic device includes a sensor.

11. The display device according to claim 2, wherein the display panel further comprises a cathode electrode disposed in the plurality of light emitting areas included in the first area, the second area, and the third area, and not disposed in the plurality of transmission areas in the third area.

12. The display device according to claim 1, wherein each of the plurality of transmission areas has a circular, elliptical, or polygonal shape.

13. The display device according to claim 1, wherein the third area has a circular, elliptical, or polygonal shape.

14. The display device according to claim 2, wherein the second area has a circular, elliptical, or polygonal shape to surround the third area.

15. The display device according to claim 1, wherein an area of each of the plurality of light emitting area is smaller than an area of each of the plurality of transmission areas.

16. The display device according to claim 8, wherein at least one layer included in the display panel has depression in the plurality of transmission areas.

17. The display device according to claim 8, wherein a transmittance of the first optical area is greater than a transmittance of the second optical area.

* * * * *